(12) United States Patent
Wachi et al.

(10) Patent No.: US 6,458,504 B2
(45) Date of Patent: Oct. 1, 2002

(54) METHOD FOR FORMING AN IMAGE

(75) Inventors: Naotaka Wachi; Kazuhito Miyake; Takeshi Konno; Akira Hatakeyama; Shigeki Kawagoe, all of Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/842,629

(22) Filed: Apr. 27, 2001

(30) Foreign Application Priority Data

Apr. 28, 2000 (JP) ........................ 2000-129445
May 23, 2000 (JP) ........................ 2000-150875

(51) Int. Cl.⁷ .............................. G03F 7/34; G03F 9/00
(52) U.S. Cl. ...................... 430/200; 430/201; 430/945; 430/952; 430/964
(58) Field of Search ................. 430/200, 952, 430/22, 201, 945, 964

(56) References Cited

U.S. PATENT DOCUMENTS 5,631,117 A * 5/1997 Nakajima et al. ........... 430/200
5,935,902 A * 8/1999 Imamura ..................... 430/200
6,326,121 B1 * 12/2001 Takahashi ................... 430/200

FOREIGN PATENT DOCUMENTS

JP 2000-255164 9/2000 ............ B41M/5/26

* cited by examiner

Primary Examiner—Richard L. Schilling
(74) Attorney, Agent, or Firm—Sughrue Mion, PLLC

(57) ABSTRACT

A method for forming an image using a transfer material and an image-receiving material. The transfer material has at least a support, a light-heat exchange layer and a coloring material layer. The image-receiving material has at least an image-receiving layer. The coloring material layer is superposed on the image-receiving layer, and laser light is image-wasely irradiated onto this laminate from the transfer material side. An irradiated region of the coloring material layer transfers onto the image-receiving layer. The transfer material may include an electroconductive layer, and the surface of the coloring material layer may be charged by corona discharge before superposition. Moreover, yellow, magenta, cyan and black may be used one after another, The laser light may be irradiated from a multi-beam 2-dimensional laser array, The thickness of black coloring material layer is from 0.5 to 0.7 μm and is greater than the thickness of other coloring material layers.

10 Claims, 3 Drawing Sheets

METHOD FOR FORMING AN IMAGE

BACKGROUND OF THE INVENTION

1. Field of the Invention

The present invention relates to a method for forming an image of high resolution by transferring an image from a transfer material onto the surface of an image-receiving material using laser light.

2. Description of the Related Art

Heretofore, a system of directly pressurizing and heating a heat transfer material with a thermal head has been applied as a method for recording an image by heat transfer. This system has superior characteristics in that it is a maintenance-free dry process that can be implemented with low noise and simple device structure. The thermal head itself has become more highly dense and, even in this system, image resolution has been achieved at considerably higher levels in recent years.

On the other hand, a laser heat transfer recording system of irradiating a transfer material with laser light, converting the laser light into heat in the transfer material and conducting heat-sensitive recording by said heat has been known as a method of recording an image of higher resolution by heat transfer. In such a system, the laser light, being a source of supplying energy, can be collected to within several microns, thus enabling a significant improvement in resolution compared with the system using the thermal head.

In the field of graphic art, a printing plate is printed by use of a set of color separation films prepared from a color original using litho-film. Generally a color proof is prepared from the color separation films in order to check for errors in a color separation step, for necessity of color correction before printing (actual printing operation), and the like. In the color proof, there is a need for realization of a high resolving power capable of good reproduction of a halftone image and for characteristics such as high process stability. Further, to obtain a color proof resembling an actual print, the materials used in the color proof are preferably those materials used in the actual printing; for example, it is preferable to use regular printing paper as a support and pigment as a coloring material. Further, a dry process using no developing solution is strongly desired as the method of preparing a color proof.

As the dry process for preparing a color proof, a recording system of preparing a color proof directly from digital signals has been developed in accordance with the recent spread of electronic systems for pre-processes in printing (the preliminary press field). The object of such an electronic system is to prepare a color proof of particularly high quality, generally to reproduce a halftone-point image of at least 150 lines/inch. For recording a high-quality proof from digital signals, a laser light that can be modulated with digital signals and a device capable of narrowing down a recording light are used as a recording head. Accordingly, it is necessary to develop a recording material showing high recording sensitivity toward laser light and showing high resolving power so as to be capable of reproducing halftone points highly accurately.

As the transfer material used in the laser heat transfer recording system, a heat-fusion transfer material is known that has, on a support in this order, a light-heat exchange layer that absorbs laser light to generate heat and an coloring material layer that has a pigment dispersed in components such as heat-fusion wax, a binder and the like (Japanese Patent Application Laid-Open (JP-A) No. 5-58045 and the like). When such a heat-fusion transfer material is used, heat generated in a laser light-irradiated region of the light-heat exchange layer causes the coloring material layer corresponding to that region to be melted and transferred onto an image-receiving material that has been superposed on the heat-fusion transfer material, thereby forming a transferred image on the image-receiving material.

JP-A No. 6-219052 describes an image-forming method which includes forming a highly accurate image on an image-receiving material superposed on a transfer material that has a light-heat exchange layer containing a light-heat exchange material, a very thin (0.03 to 0.3 $\mu$m) thermally releasable layer, and a coloring material layer containing a coloring material arranged in this order on a support. In this method, a binding force between the coloring material layer and the light-exchange layer, which are bound via the thermally releasable layer, is reduced by irradiation with laser light. In this image-forming method, so-called "abrasion" is utilized. Specifically, the thermally releasable layer is partially decomposed and gasified in a region irradiated with laser light, thus weakening the binding force between the coloring material layer and the light-heat exchange layer in that region, and permitting the coloring material layer in that region to be transferred onto the image-receiving material superposed on the transfer material, thereby forming a transferred image on the image-receiving material.

An image-forming method utilizing laser light has advantages such as usability of regular printing paper provided with an image-receiving layer (adhesive layer) as the image-receiving material, easy provision of a multi-color image by successive transfer of images of different colors onto the image-receiving material, and the like. In particular, an image-forming method utilizing abrasion has the advantage of easy provision of a highly accurate image, and is particularly useful for forming a color proof (direct digital color proof (DDCP)) or a highly accurate mask image.

In these methods of forming an image by heat transfer, the resolution of the image is significantly influenced by adhesion between the transfer material and the image-receiving material during transfer of the image. Thus, increasing the adhesion between the two is a key to achieving high-resolution images.

As a method of increasing the adhesion between the transfer material and the image-receiving material, a method in which the transfer material and/or the image-receiving material is provided with a cushion layer endowed with flexibility, to absorb unevenness between the two, has been disclosed (JP-A No. 5-169861).

However, if the image-receiving material is provided with the cushion layer, it is hard to use the image-receiving material as a final recording medium. Thus a step of transferring an image formed on the image-receiving material onto a final recording medium is necessitated, which causes the problem of a complicated process. Further, if the transfer material is provided with the cushion layer and the image-receiving material is used as a final recording medium, there will be cases where unevenness of the surface of the final recording medium cannot be sufficiently absorbed by the cushion layer. Thus, there is a need for an image-forming method capable of forming a high-quality image with high resolution even if adhesion between the transfer material and the image-receiving material is not guaranteed.

Further, in recent years, in order to reduce recording time when recording an image with laser light, a laser light consisting of a multi-beam two-dimensional array, in which a plurality of laser beams is used, has been used. When recording on a conventional heat transfer sheet with a laser light in a multi-beam two-dimensional array, there are cases where the density of the transferred image formed on the image-receiving sheet becomes insufficient. In particular, the density of the image is significantly reduced in the case of laser recording with high energy. As a result of investigations, by the inventors of the present invention, it was found that this reduction in the density of the image is caused by uneven transfer occurring in laser recording with high energy.

SUMMARY OF THE INVENTION

Accordingly, an object of the present invention is to provide an image-forming method capable of forming a transferred image having high resolution, high quality and good color tones, without parts missing from the image, even if a transfer material and an image-receiving material are not provided with a cushion layer.

Another object of the present invention is to provide a method for forming a multi-color image which method can form a high-quality image with stable transfer density on an image-receiving sheet, even if laser recording is conducted with high-energy by a laser beam in a multi-beam two-dimensional array under various temperature and humidity conditions.

A first aspect of the invention is a method for forming an image, the method comprising the steps of: charging, by corona discharge, a coloring material layer surface of a transfer material, which has at least a light-transmissive support, a light-transmissive electroconductive layer, a light-heat exchange layer and a coloring material layer; thereafter superposing an image-receiving layer surface of an image-receiving material, which has at least a support and an image-receiving layer, with the coloring material layers surface; and irradiating laser light imagewisely onto the transfer material, thereby transferring an irradiated portion of the coloring material layer of the transfer material to the image-receiving layer surface, for forming the image on the image-receiving layer surface of the image-receiving material.

A second aspect of the invention is a method for forming a multi-color image, the method comprising the steps of: providing an image-receiving material, which has an image-receiving layer, and four transfer materials, of yellow, magenta, cyan and black, each of which has, on a support, at least a light-heat conversion layer and a coloring material layer; opposing and superposing the coloring material layer of each transfer material with the image-receiving layer of the image-receiving material; and irradiating laser light, which is a multi-beam 2-dimensional array of laser beams, from a support side of the each transfer material, thereby transferring a laser-light irradiated region of the coloring material layer of the each transfer material onto the image-receiving layer of the image-receiving material, for recording the image, wherein layer thickness of the coloring material layer of the black transfer material is greater than layer thickness of the coloring material layer of each of the yellow, magenta and cyan transfer materials, and the layer thickness of the coloring material layer of the black transfer material is from 0.5 to 0.7 μm.

DETAILED DESCRIPTION OF THE PREFERRED EMBODIMENTS

Figure 1:
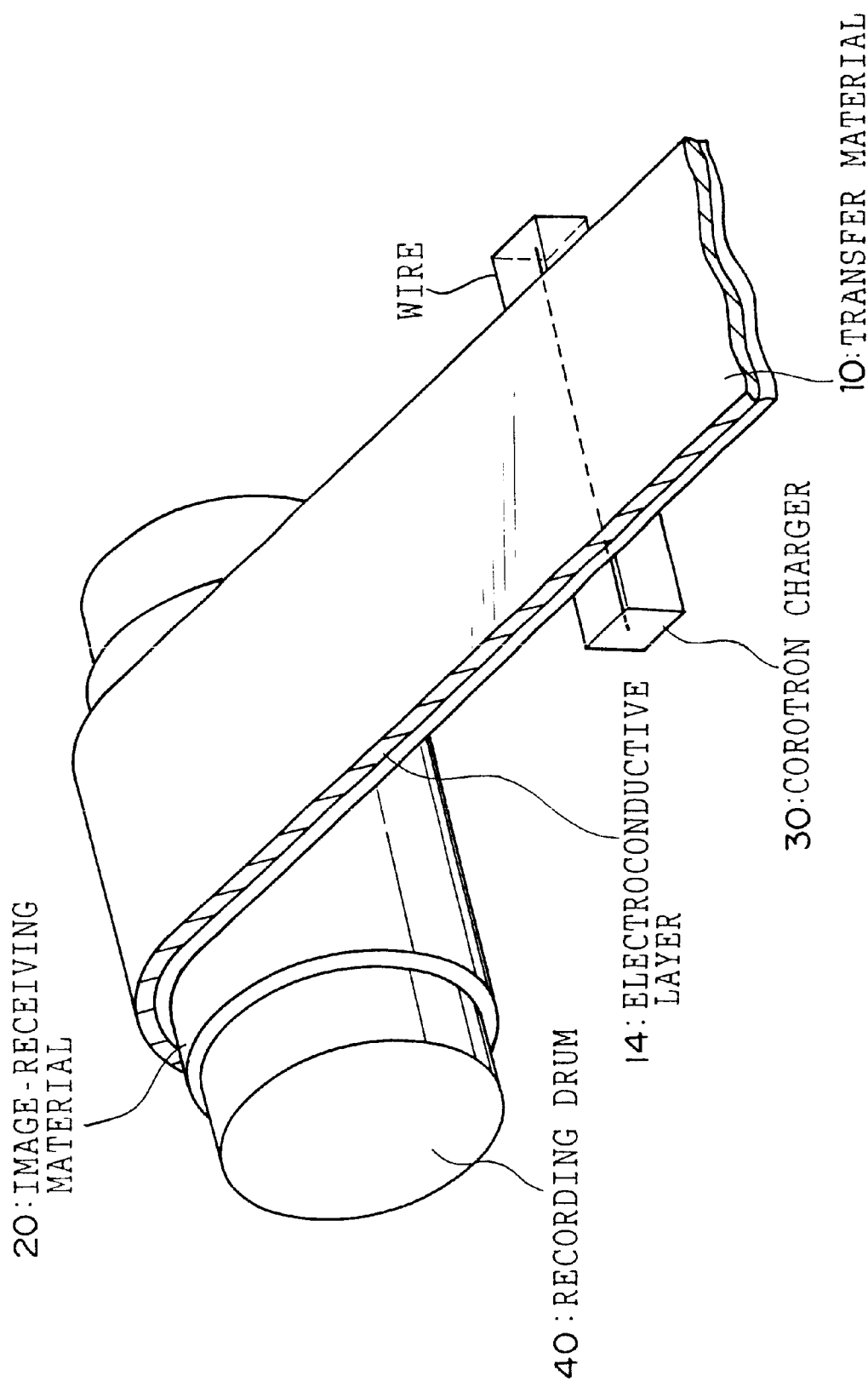
FIG. 1 is a perspective view showing the concept of an image-forming method of the present invention.

Hereinafter, a method for forming an image of the present invention is described with reference to the drawings. FIG. 1 is a conceptual drawing showing the method for forming an image of the present invention. In FIG. 1, 10 indicates a transfer material having an electroconductive layer 14, 20 indicates an image-receiving material, 40 indicates a recording drum and 30 indicates a corotron charger using a wire, which is one kind of corona charger. The image-receiving material is placed closely on the recording drum 40. Before the transfer material is transported onto the image-receiving material, a coloring material layer surface is corona-charged. After being charged, the charged transfer material is transported and laid over the image-receiving material 20. Then this arrangement is subjected to imagewise irradiation with a laser in time series from a transfer material side (see FIG. 2). Thus, the coloring material layer is transferred. Thereafter, the image-receiving material is peeled from the transfer material.

Figure 2:
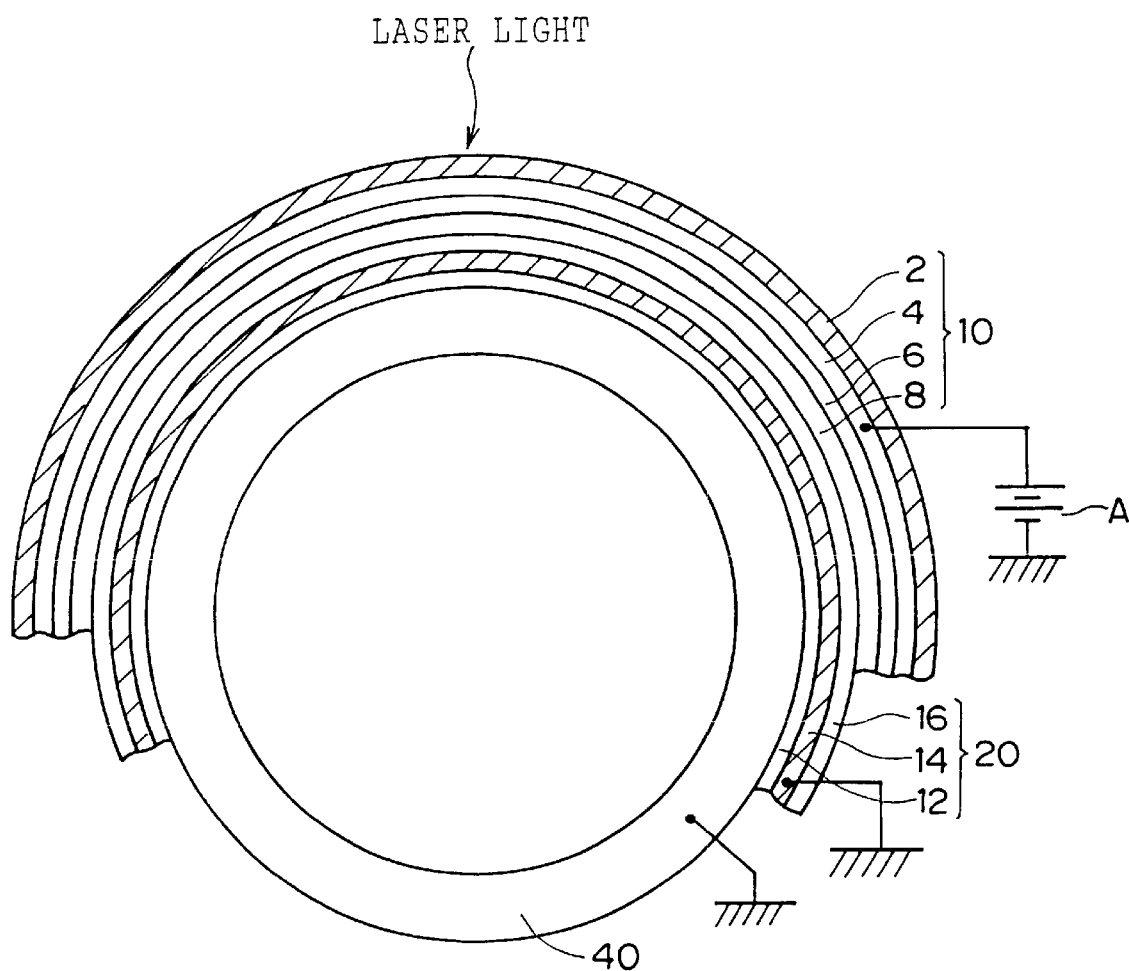
FIG. 2 is a sectional view showing an example of an image-receiving material and a transfer material used in the present invention.

FIG. 2 shows a sectional structure of one example of the transfer material and the image-receiving material. In this example, the transfer material 10 consists of an electroconductive layer 2, a support 4, a light-heat exchange layer 6 and a coloring material layer 8, while the image receiving material 20 consists of a support 12, an electroconductive layer 14 and an image-receiving layer 16.

By this method, a high-quality image free of missing parts can be obtained.

Figure 3A:
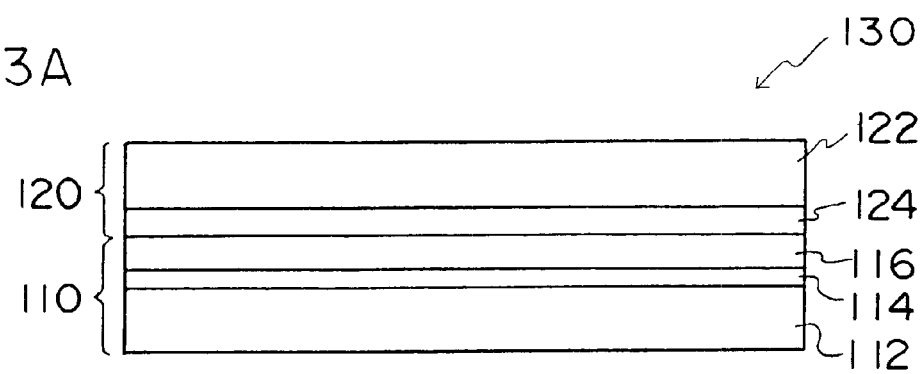
FIGS. 3A to 3C are sectional views showing an outline of a step in a method of forming a multi-color image of the present invention.
Figure 3B:
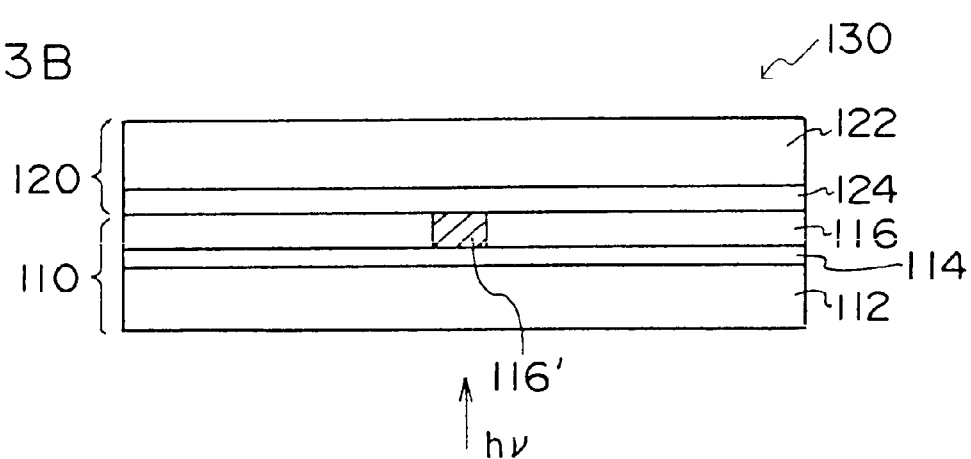
Figure 3C:
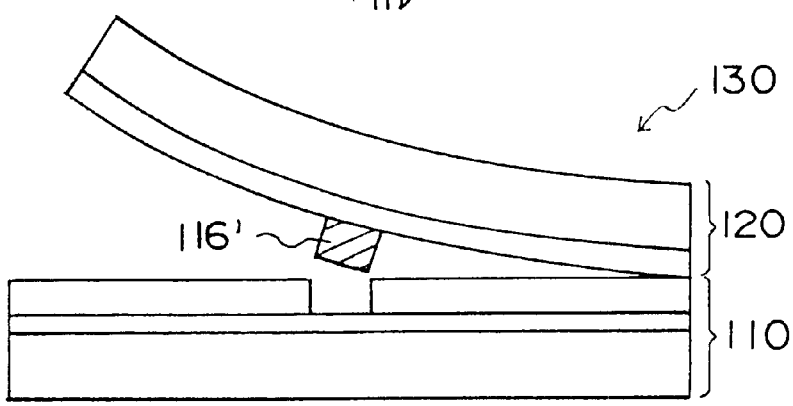

An outline of a multi-color image-forming method in a second aspect of the invention is described with reference to FIGS. 3A to 3C.

An image-forming laminate 130 having an image-receiving sheet 120 superposed on a surface of a coloring material layer 116 of a transfer material 110 is prepared. The transfer material 110 has a support 112 with a light-heat exchange layer 114 and the coloring material layer 116 in that order thereon. The image receiving sheet 120 has a support 122 with an image-receiving layer 124 thereon. The image-receiving layer 124 is laminated so as to be in contact with the surface of the coloring material layer 116 of the transfer material 110 (FIG. 3A). Upon imagewise irradiation with a laser light in time series onto the support 112 side of the transfer material 110 in the laminate 130, a laser light-irradiated region of the light-heat exchange layer 114 of the transfer material 110 generates heat, which lowers adhesion between the light-heat exchange layer 114 and the coloring material layer 116 (FIG. 3B). Thereafter, when the image-receiving sheet 120 is peeled from the transfer material 110, a laser light-irradiated region 116' of the coloring material layer 116 is transferred onto the image-receiving layer 124 of the image-receiving sheet 120 (FIG. 3C).

Below, the transfer material and the image-receiving sheet used in the image-forming method of the present invention are described.

Transfer Material

The transfer material used in the present invention has at least a light-heat exchange layer and an coloring material layer on a support, and other layers as necessary (an electroconductive layer, a cushion layer, a heat-sensitive release layer, a light reflection-preventing layer, and the like).

(Support)

A material of the support of the transfer material is not particularly limited, and a wide variety of support materials can be used depending on objectives. Preferable examples of such support materials include synthetic resin materials such as polyethylene terephthalate, polyethylene-2,6-naphthalate, polycarbonate, polyethylene, polyvinyl chloride, polyvinylidene chloride, polystyrene, styrene-acrylonitrile copolymers and the like. Among these, biaxially oriented polyethylene terephthalate is preferable in consideration of mechanical strength and dimensional stability in response to heat. If the transfer material is to be used in preparation of a color proof utilizing laser recording or in the image-forming method of the first aspect of the invention, the support for the transfer material is preferably formed from a transparent synthetic resin material that will permit laser light to pass therethrough.

To improve adhesion to a layer provided thereon, the support for the transfer material may be subjected to a surface activation treatment and/or provided with one or more undercoat layers. Examples of the surface activation treatment include glow discharge treatment, corona discharge treatment and the like. A material for the undercoat layer is preferably a material showing strong adhesion to both the surface of the support and the surface of the layer thereon, having low thermal conductivity and being excellent in heat resistance. Examples of such materials for the undercoat layer include polystyrene, styrene-butadiene copolymer, gelatin and the like. The total thickness of the undercoat layers is usually 0.01 to 2 $\mu$m. A side of the transfer material opposite to the side on which the light-heat exchange layer is provided may be provided with various functional layers thereon, such as a reflection-preventing layer and an antistatic layer, as necessary, or can be subjected to surface treatment.

(Electroconductive layer)

The transfer material used in the image-forming method of the first aspect of the present invention has an electroconductive layer on the support.

The electroconductive layer in the transfer material includes a layer including of, for example, an electroconductive material and a binder. Examples of the electroconductive material include tin oxide, polyethylene glycol, carbon black, surfactants, inorganic salts and the like. Of these, fine particles of tin oxide doped with antimony, as described in JP-A No. 61-20033, are preferably used. Needle-like fine particles of tin oxide, described in JP-A No. 11-15109, are more preferable. As the binder, a binder as described in the below section describing the light-heat exchange layer is preferably used. The electroconductive layer is formed by coating and drying a coating solution prepared with the electroconductive material and the binder in a suitable solvent.

The thickness of the electroconductive layer is 0.01 to 2 $\mu$m, preferably 0.05 to 0.15 $\mu$m. If the thickness is less than 0.01 $\mu$m, the electroconductive layer will be susceptible to the influence of temperature and humidity, leading to unstable electrical conductivity. On the other hand, if the thickness is greater than 2 $\mu$m, transparency of the transfer material is likely to be lowered. Accordingly, the thickness of the electroconductive layer is suitably in the range described above.

Surface resistivity of the electroconductive layer is preferably not greater than $10^{11}$ $\Omega/\square$. If the surface resistivity is greater than $10^{11}$ $\Omega/\square$, charging by corona charging will be difficult. Preferably, the surface resistivity is not greater than $10^9$ $\Omega/\square$.

The position of the electroconductive layer in the transfer material is not particularly limited, but it is preferable that the electroconductive layer is provided at the support side of the light-heat exchange layer so that, upon lamination onto the image-receiving material, the corona-charged transfer material attains good adhesion to the image-receiving material.

Further, it is preferable in the image-forming method of the first aspect of the present invention that the image-receiving material is also provided with the electroconductive layer. In this case, a thickness distance from the surface of the coloring material layer to the electroconductive layer in the transfer material is preferably equal to or greater than a thickness distance from the surface of the image-receiving layer to the electroconductive layer in the image-receiving material. Accordingly, a preferably used transfer material has, for example, the electroconductive layer provided on one surface of the light-transmissive support, and the light-heat exchange layer and the coloring material layer in that order on the other surface of the support.

(Light-heat exchange layer)

The light-heat exchange layer contains a light-heat exchange material, a binder resin and, as necessary, a matting material and other components.

The light-heat exchange material is a material having the facility to convert irradiated light energy into heat energy. Generally, the material is a colorant capable of absorbing laser light (possibly a pigment; this applies hereinafter). In a case of recording an image with an infrared laser, the light-heat exchange material used is preferably a colorant that absorbs infrared rays.

Examples of the colorant (pigment or the like) include organic colorants and black pigments such as carbon black. In the present invention, an organic colorant is preferably used in view of film strength of the light-heat exchange layer.

Examples of such organic colorants include pigments which are large cyclic compounds having absorption in the visible to near-infrared region, such as phthalocyanine and naphthalocyanine; organic dyes used as laser-absorbing materials for high-density laser recording on optical disks and the like (cyanine dyes besides indolenine dyes, anthraquinone dyes, azulene colorants and phthalocyanine dyes); and organometal compound colorants such as dithiolnickel complexes and the like. Among these, the cyanine colorants are preferable in view of efficiency of light-heat exchange and resistance to destruction by laser light. The light-heat exchange material desirably has a high ability to exchange light to heat. Indolenine compounds of formula (I) described in Japanese Patent Application No. 10-140924 can be mentioned as particularly preferable light-heat exchange materials.

As the light-heat exchange material, besides the colorants, inorganic materials, granular metal materials such as black silver and the like, can also be used.

The binder resin contained in the light-heat exchange layer is preferably a resin having high thermal conductivity and at least enough strength to form the layer on the support. Further, the binder resin is preferably a heat-resistant resin that will not be decomposed even by heat generated by the light-heat exchange material in recording an image, so that the light-heat exchange layer, even when irradiated with light of high energy, can maintain its surface smoothness after light irradiation. Specifically, a resin having a thermal decomposition temperature (a temperature at which weight of the resin is reduced by 5% in an air stream with temperature increasing at 10° C./min in the TGA method) of not less than 400° C. is preferable, and a resin with a thermal decomposition temperature of not less than 500° C. is more preferable. Further, the binder resin preferably has a glass transition temperature of from 200 to 400° C., more preferably from 250 to 350° C. If the glass transition temperature is lower than 200° C., fogging may occur on the formed image, while if the same is higher than 400° C., solubility of the resin may be lowered, lowering the efficiency of production.

The heat resistance (e.g., thermal deformation temperature and thermal decomposition temperature) of the binder resin in the light-heat exchange layer is preferably higher than that of materials used in other layers formed on the light-heat exchange layer.

Examples of such a binder include homopolymers and copolymers of acrylic monomers such as acrylic acid and the like (e.g. poly(methyl methacrylate)); cellulose polymers such as cellulose acetate and the like; polycarbonate; polystyrene; vinyl polymers such as vinyl chloride/vinyl acetate copolymers; polyvinyl butyral, polyvinyl alcohol, polyvinyl chloride and the like; condensed polymers such as polyester, polyamide, polyimide and the like; polyether imide; polysulfone; polyether sulfone; aramide; rubber-type thermoplastic polymers such as butadiene/styrene copolymers; polyurethane; epoxy resin; urea/melamine resin and the like. Among these, polymers such as polyvinyl alcohol, polyvinyl butyral, polyester and polyimide are preferably used. As a particularly preferable binder, a polyimide resin described in Japanese Patent Application No. 10-140924 can be mentioned.

Further, the polyimide resins represented by formulae (I) to (VII) below are soluble in an organic solvent, and use of these polyimide resins is preferable because productivity of the transfer material is improved. Also, use of these is further preferable in view of improvement of viscosity stability, long-term stability and moisture resistance of a coating solution for the light-heat exchange layer.

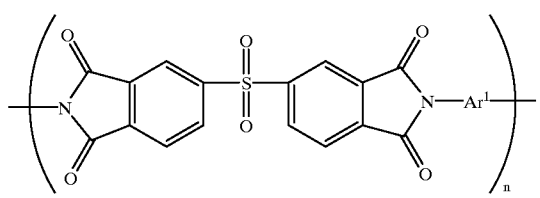
(I)

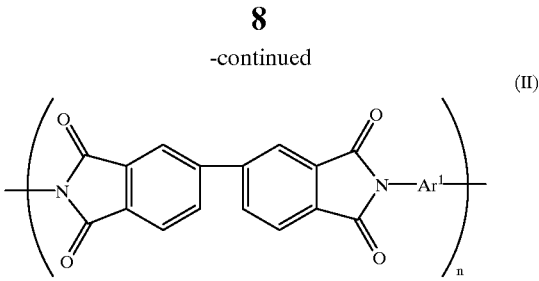
(II)

In the formulae (I) and (II) above, $Ar^1$ represents an aromatic group represented by the structural formulae (1) to (3) below, and n is an integer from 10 to 100.

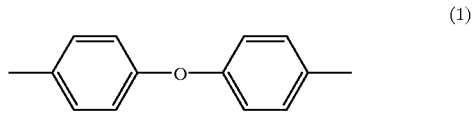
(1)

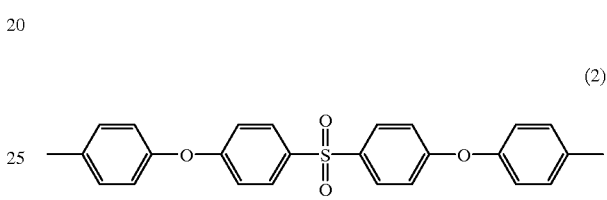
(2)

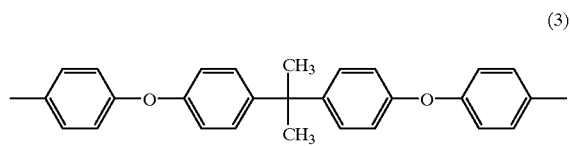
(3)

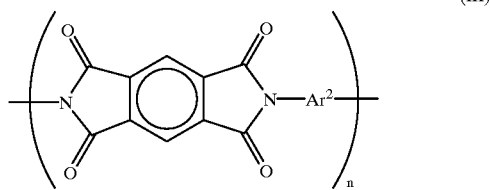
(III)

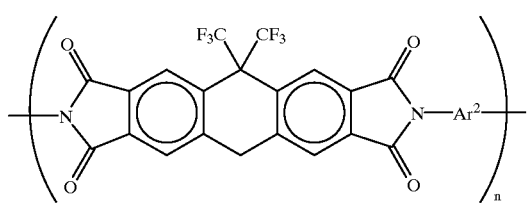
(IV)

In the formulae (III) and (IV), $Ar^2$ represents an aromatic group represented by the structural formulae (4) to (7) below, and n is an integer from 10 to 100.

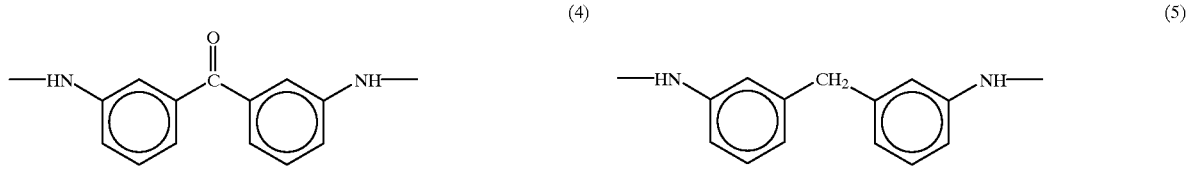
(4) (5)

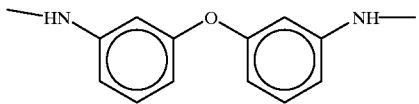
(6)

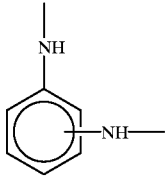
(7)

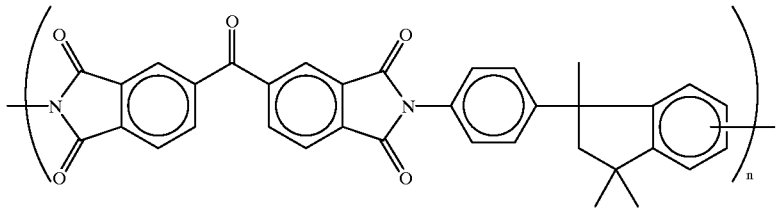
(V)

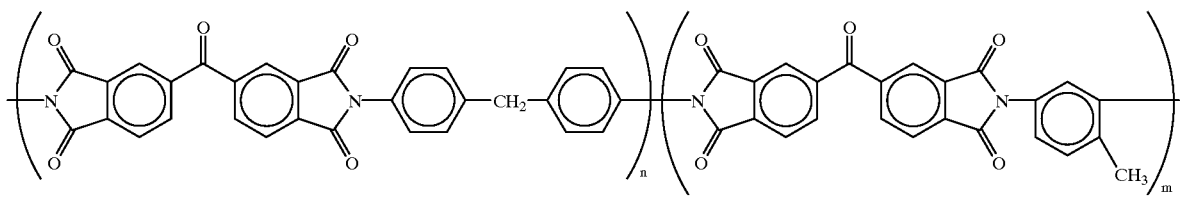
(VI)

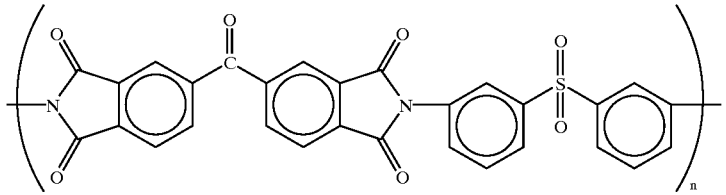
(VII)

In the formulae (V) to (VII) above, n and m are integers from 10 to 100. In the formula (VI), an n:m ratio is from 6:4 to 9:1.

A criterion for judging whether the resin is soluble in an organic solvent or not is whether or not at least 10 parts by weight of the resin is dissolved in 100 parts by weight of N-methylpyyolidone at 25° C. If at least 10 parts by weight of the resin is dissolved, said resin can be used preferably for the light-heat exchange layer. A more preferable resin is a resin which is dissolved in an amount of at least 100 parts by weight in 100 parts by weight of N-methylpyrrolidone.

A matting agent contained in the light-heat exchange layer includes inorganic fine particles and organic fine particles. Examples of inorganic fine particles include metal salts such as silica, titanium oxide, aluminum oxide, zinc oxide, magnesium oxide, barium sulfide, magnesium sulfide, aluminum hydroxide, magnesium hydroxide and boron nitride, as well as kaolin, clay, talc, zinc white, white lead, zeeklite, quartz, diatomaceous earth, pearlite, bentonite, mica, synthetic mica and the like. Examples of organic fine particles include resin particles such as fluoroplastic particles, guanamine resin particles, acrylic resin particles, styrene-acrylic acid copolymer resin particles, silicone resin particles, melamine resin particles, epoxy resin particles and the like.

The particle diameter of the matting agent is usually 0.3 to 3 μm and, preferably 0.5 to 20 μm. The amount of the matting agent added is preferably 0.1 to 100 mg/m².

A surfactant, a thickening agent, an antistatic agent and the like may be added to the light-heat exchange layer as necessary.

The light-heat exchange layer can be provided by preparing a coating solution, including the light-heat exchange material, the binder resin, and, as necessary, the matting agent and other components, then coating this solution onto the support and drying. Example of an organic solvent for dissolving the polyimide resin include n-hexane, cyclohexane, diglyme, xylene, toluene, ethyl acetate, tetrahydrofuran, methyl ethyl ketone, acetone, cyclohexanone, 1,4-dioxane, 1,3-dioxolane, dimethyl acetate, N-methyl-2-pyrrolidone, dimethyl sulfoxide, dimethyl formamide, dimethyl acetamide, γ-butyrolactone, ethanol, methanol, water and the like. Coating and drying can be carried out using conventional coating and drying methods. Drying is carried out usually at a temperature of 300° C. or less, and preferably at a temperature of 200° C. or less. If polyethylene terephthalate is used for the support drying is preferably carried out at a temperature of 80 to 150° C.

If the amount of the binder resin in the light-heat exchange layer is too low, cohesive force of the light-heat exchange layer will be low and, when a formed image is transferred onto the image-receiving sheet, the light-heat exchange layer will be easily transferred together therewith, which will cause color mixture in the image. On the other hand, if an amount of polyimide resin is too high, the thickness of the light-heat exchange layer required for achieving a predetermined light absorptivity will increase, which will tend to cause a reduction in sensitivity. A ratio by weight of solid content of the light-heat exchange material to binder resin in the light-heat exchange layer is preferably from 1:20 to 2:1, and more preferably from 1:10 to 2:1.

Making the light-heat exchange layer thinner is preferable, because then the transfer material can be rendered highly sensitive. The thickness of the light-heat exchange layer is preferably 0.03 to 1.0 µm, more preferably 0.03 to 0.8 µm, further preferably 0.05 to 0.5 µm and particularly preferably 0.05 to 0.3 µm. Further, a maximum absorption wavelength of the light-heat exchange layer is preferably in the range of 700 to 1500 nm, and more preferably in the range of 750 to 1000 nm. Absorbance (optical density) at these wavelengths is preferably in the range of 0.1 to 1.3, and more preferably 0.2 to 1.1. Further preferably, in order to improve transfer sensitivity of the coloring material layer, the light-heat exchange layer has an optical density of 0.7 to 1.1, more preferably 0.8 to 1.0, with respect to light of a wavelength of 830 nm. If the optical density at a wavelength of 830 nm is less than 0.7, the conversion of irradiated light into heat may become unsatisfactory, resulting in a reduction in transfer sensitivity. On the other hand, if the optical density exceeds 1.1, the function of the light-heat exchange layer during recording may be influenced, causing fogging.

(Coloring material layer)

The coloring material layer contains at least a colorant to be transferred onto the image-receiving sheet to form an image, and further contains a binder resin for forming the layer and, as necessary, other components.

In an image-forming method of the first aspect of the present invention, surface resistivity of the coloring material layer, that is, the surface resistivity of the transfer material at a side thereof in contact with the image-receiving material, is preferably set at $10^{11}$ Ω/□ or more. This is preferable because if the surface resistivity is lower than this range, when corona-charging the surface of the coloring material layer, the charge will be leaked immediately and thus the effect of charging will be lost.

Generally, colorants can be roughly divided into organic colorants and inorganic colorants. The former are excellent in transparency of a coating, while the latter are generally excellent in shielding properties and the like. Thus, depending on the intended use, suitable selection can be made. If the transfer material is to be used for proof of printing colors, organic colorants corresponding to or near in color tone to yellow, magenta, cyan and black, which are generally used in printing inks, can be preferably used. Besides thus, there are also cases where metal powder or fluorescent pigments can be used. Examples of preferably used colorants include azo colorants, phthalocyanine colorants, anthraquinone colorants, dioxazine colorants, quinacridone colorants, isoindolinone colorants, and nitro colorants. Pigments that can be used in the coloring material layer include, but are not limited to, the following listed pigments, which are classified depending on hue.

1) Yellow pigments

Hansa yellow G, Hansa yellow 5G, Hansa yellow 10G, Hansa yellow A, pigment yellow L, permanent yellow NCG, permanent yellow FGL, permanent yellow HR, titanium yellow.

2) Red pigments

Permanent red 4R, permanent red F2R, permanent red FRL, lake red C, lake red D, pigment scarlet 3B, Bordeaux 5B, alizarine lake, rhodamine lake B.

3) Blue pigments

Phthalocyanine blue, Victoria blue lake, Fast sky blue.

4) Black pigments

Carbon black, titanium black.

The average diameter of pigment particles is preferably 0.03 to 1 µm, more preferably 0.05 to 0.5 µm.

If the diameter is less than 0.3 µm, dispersion cost may increase and the dispersion may gel or the like. If the diameter is greater than 1 µm, large-sized particles may impair adhesion between the coloring material layer and the image-receiving layer.

In the present invention, it is preferable, in view of color tone of a printed image, that an organic colorant to be added to the light-heat exchange layer is substantially not contained in the coloring material layer. In the present invention, the phrase "the organic colorant is substantially not contained in the coloring material layer" means that the optical density of the organic colorant is not more than 5% of total optical density (including optical density of the support) at a wavelength at which an absorption peak of the transmission optical density of the coloring material layer occurs.

The binder resin in the coloring material layer is preferably an amorphous organic polymer having a softening point of 40 to 150° C. Examples of amorphous organic polymers include butyral resin; polyamide resin; polyethylene-imine resin; sulfonamide resin; polyester-polyol resin; petroleum resin; homopolymers and comopolymers of styrene and derivatives thereof such as styrene, vinyltoluene, α-methylstyrene, 2-methylstyrene, chiorostyrene, vinylbenzoic acid, sodium vinylbenzenesulfonate, aminostyrene and the like; and homopolymers of methacrylic acid and methacrylates (e.g. methyl methacrylate, ethyl methacrylate, butyl methacrylate, and hydroxyethyl methacrylate) and acrylic acid and acrylates (e.g. methyl acrylate, ethyl acrylate, butyl acrylate and α-ethyl hexyl acrylate), dienes (e.g. butadiene and isoprene) acrylonitrile, vinyl ethers, maleic acid and maleates, maleic anhydride, cinnamic acid, vinyl monomers (e.g. vinyl chloride and vinyl acetate), and copolymers thereof with other monomers or the like. These resins can also be used in a mixture of the two or more thereof.

The coloring material layer preferably contains 30 to 70% by weight of the colorant, and the colorant is preferably contained in an amount of 40 to 60% by weight in the image-forming method in the first aspect of the present invention and in an amount of 30 to 50% by weight in the image-forming method in the second aspect. The coloring material layer preferably contains 70 to 30% by weight of the resin, and the resin is preferably contained in an amount of 60 to 40% by weight in the image-forming method in the first aspect and in an amount of 70 to 40% by weight in the image-forming method in the second aspect.

The coloring material layer can contain the following components (1) to (3) as the other components:

(1) Wax

Example waxes include mineral waxes, natural waxes and synthetic waxes. Preferable examples of mineral waxes include petroleum waxes such as paraffin wax, microcrystalline wax, ester wax, oxidized wax and the like, as well as montan wax, ozokerite, ceresin and the like. Among these, paraffin wax is preferable. Paraffin wax is separated from petroleum and, depending on melting point, various kinds of paraffin wax are commercially available.

Examples of natural waxes include vegetable waxes such as carnauba wax, Japan wax, ouricury wax, and espal wax and the like, as well as animal waxes such as beeswax, insect wax, shellac wax, spermaceti and the like.

The synthetic waxes are used generally as lubricants, and are usually composed of higher fatty acid compounds. Examples of synthetic waxes include:

1) Fatty acid-based wax

Straight-chain saturated fatty acids represented by the following formula:

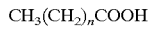

$$CH_3(CH_2)_nCOOH$$

wherein n is an integer of 6 to 28. Specific examples thereof include stearic acid, behenic acid, palmitic acid, 12-hydroxystearic acid, azelaic acid and the like.

2) Fatty ester-based wax

Specific examples of fatty esters include ethyl stearate, lauryl stearate, ethyl behenate, hexyl behenate, behenyl myristate and the like.

3) Fatty amide-based wax

Examples of fatty amides include stearic amide, lauric amide and the like.

4) Fatty alcohol-based wax

Straight-chain saturated fatty alcohols represented by the following formula:

$$CH_3(CH_2)_nOH$$

wherein n is an integer of 6 to 28. Specific examples thereof include stearyl alcohol and the like.

Among the synthetic waxes described in 1) to 4) above, higher fatty amides such as stearic amide and lauric amide are particularly suitable. The wax compounds mentioned above can be used singly or in a suitable combination thereof as required.

(2) Plasticizer

If a multi-color image is formed by repeatedly overlaying on the same image-receiving material a large number of image layers (coloring material layers having an image formed thereon) using a plurality of transfer materials, the coloring material layer preferably contains a plasticizer, in order to increase adhesion between images.

The plasticizer is preferably an ester compound, and mention can be made of known plasticizers, for example, phthalates such as dibutyl phthalate, di-n-octyl phthalate, di(2-ethylhexyl) phthalate, dinonyl phthalate, dilauryl phthalate, butyl lauryl phthalate, butyl benzyl phthalate, and the like; aliphatic dibasic acid esters such as di(2-ethylhexyl) adipate, di(2-ethylhexyl) sebacate, and the like; phosphoric acid triesters such as such as tricresyl phosphate, tri(2-ethylhexyl) phosphate and the like; polyol polyesters such as polyethylene glycol ester and the like; epoxy compounds such as epoxy fatty esters and the like; and the like. Among these, esters of vinyl monomers, particularly acrylates or methacrylates, are preferably added, in respect of improvement of transfer sensitivity and alleviating transfer unevenness, and of greater effect of regulating breaking elongation.

Examples of the acrylates and methacrylates include polyethylene glycol dimethacrylate, 1,2,4-butanetriol trimethacrylate, trimethylolethane triacrylate, pentaerythritol acrylate, pentaerythritol tetraacrylate, dipentaerythritolpolyacrylate and the like.

The plasticizer may include polymers, among which polyesters are preferable in respect of greater effect and resistance to diffusion under storage conditions. Example polyesters include sebacic acid-based polyesters, adipic acid-based polyesters and the like.

Additives contained in the coloring material layer are not limited to those described above. Moreover, the plasticizers may be used singly or in combination.

If the content of the additives in the coloring material layer is too high, resolution of the transfer image may be lowered, film strength of the coloring material layer itself may be lowered, and transfer to the image-receiving sheet at non-irradiated portions may occur because of a reduction in adhesion between the light-heat exchange layer and the coloring material layer. In view of the foregoing, wax content is preferably 0.1 to 30% by weight, and more preferably 1 to 20% by weight, based on total solid content of the coloring material layer. The plasticizer is used generally in such an amount that a ratio of the total weight of the colorant and amorphous organic polymer in the coloring material layer to the plasticizer is in a range from 100:1 to 100:3, preferably from 100:1.5 to 100:2. Moreover, the content of the plasticizer is preferably 0.1 to 20% by weight, more preferably 0.1 to 10% by weight, based on the total solid content in the coloring material layer.

(3) Other materials

The coloring material layer may further contain surfactants, inorganic or organic fine particles (metal powder, silica gel or the like), oils (linseed oil, mineral oil or the like), thickening agents, antistatic agents and the like in addition to the components described above. Except for cases where a black image is to be obtained, the energy necessary for transfer can be reduced by incorporation of a material that absorbs at the wavelength of a light source to be used for recording an image. The material that absorbs at the wavelength of the light source may be a pigment or a dye. When a color image is to be obtained, it is preferable for color reproduction that an infrared light source such as a semiconductor laser or the like is used for recording the image, and a dye having considerable absorption at the wavelength of the light source and less absorption in the visible region is used as the material. Examples of near infrared dyes include compounds described in JP-A No. 3-103476.

The thickness of the coloring material layer (thickness of the layer when dried) is preferably 0.2 to 1.5 μm, and more preferably 0.3 to 1.0 μm.

However, in the multi-color image-forming method of the second aspect of the invention, the thickness of the coloring material layer in a black transfer material is characterized by being greater than the thickness of the coloring material layer in each of yellow, magenta and cyan transfer materials, and being in the range of 0.5 to 0.7 μm. With this arrangement, a reduction in density due to uneven transfer when the black transfer material is laser-irradiated can be prevented.

If the thickness of the coloring material layer in the black transfer material is less than 0.5 μm, density of the image is significantly lowered due to uneven transfer during recording with high energy, and thus the image density necessary for a printing proof cannot be achieved. Because this trend is significant under high humidity conditions, changes in density due to the environment become significant. On the other hand, if the layer thickness exceeds 0.7 μm, the transfer sensitivity is lowered during laser recording, thus adversely affecting application of small dots and further thinning thin lines. This trend is more significant under low humidity conditions. Also, resolving power may deteriorate. The thickness of the coloring material layer in the black transfer material is more preferably 0.55 to 0.65 μm, and particularly preferably 0.60 μm.

Further, while the thickness of the coloring material layer in the black transfer material is 0.5 to 0.7 μm, the thickness of the coloring material layer in each of the yellow, magenta and cyan transfer materials is preferably equal to or greater than 0.2 μm and less than 0.5 μm.

If the thickness of the coloring material layer in each of the yellow, magenta and cyan transfer materials is less than 0.2 μm, there may occur a reduction in density due to uneven transfer during laser recording, and if the thickness is equal to or greater than 0.5 m, there may occur a reduction in transfer sensitivity or a deterioration in resolving power. The thickness is more preferably 0.3 to 0.45 μm.

The coloring material layer in the black transfer material preferably contains carbon black, and more preferably contains at least two kinds of carbon blacks which are different in tinting strength, so that reflection density can be controlled while a P/B (pigment/binder) ratio is maintained in a predetermined range.

The tinting strength of carbon black is shown by various methods. For example, PVC blackness, described in JP-A No. 10-140033 and the like, can be mentioned. The PVC blackness is determined as follows: Carbon black is added to PVC resin, dispersed by a twin-screw roll and formed into a sheet. The (PVC) blackness of the sheet is evaluated by visual judgment with standard points 1 and 10 assigned to the blackness of carbon black "#40" and carbon black "#45" (Mitsubishi Chemical Corp.), respectively. In the present invention, two or more kinds of carbon black which are different in PVC blackness can be suitably selected and used depending on objectives.

Hereinafter, a concrete method of preparing a sample is described.

<Method of preparing a sample>

40% by weight sample of carbon black is mixed with LDPE resin by a 250 cc Banbury mixer and kneaded at 115° C. for 4 minutes.

| Compounding conditions LDPE resin | 101.89 g |
|---|---|
| Calcium stearate | 1.39 g |
| IRUGANOX 1010 | 0.87 g |
| Sample carbon black | 69.43 g |

Then, the mixture is diluted at 120° C. by a twin-screw roll mill such that the concentration of carbon black becomes 1% by weight.

Conditions for preparing the diluted compound

| LDPE resin | 58.3 g |
|---|---|
| Calcium stearate | 0.2 g |
| Resin mixed with 40 wt. % carbon black | 1.5 g |

The sample is formed into a sheet with a slit width of 0.3 mm, and this sheet is cut into chips and formed into a 65±3 μm film on a hot plate at 240° C.

The coloring material layer can be provided by preparing a coating solution having the pigment, the binder resin and the like dissolved or dispersed therein and coating the coating solution onto the light-heat exchange layer (or onto a heat-sensitive release layer, described below,if the same is provided on the light-heat exchange layer) and drying. Solvents that can be used for preparing the coating solution include not only those described above in the section on formation of the light-heat exchange layer but also n-propyl alcohol, methyl ethyl ketone, propylene glycol monomethyl ether (MFG), methanol and the like. Coating and drying can be carried out by utilizing usual coating and drying methods.

A heat-sensitive release layer can be provided between the light-heat exchange layer and the coloring material layer in the transfer material described above. The heat-sensitive release layer contains a heat-sensitive material for generating a gas or for releasing water or the like, by the action of heat generated in the light-heat exchange layer, thereby weakening adhesion between the light-heat exchange layer and the coloring material layer. Such a heat-sensitive material can make use of a compound (a polymer or a low-molecular compound) which is decomposed or modified in itself by heating to generate a gas, a compound (a polymer or a low-molecular compound) which absorbs or adsorbs a considerable amount of a gas which is easily vaporized, such as water, or the like. These may be used in combination.

Examples of polymers that are decomposed or modified by heating to generate a gas include self-oxidative polymers such as nitro cellulose; halogen-containing polymers such as chlorinated polyolefins, chlorinated rubber, poly(rubber chloride), polyvinyl chloride and polyvinylidene chloride; acrylic polymers such as polyisobutyl methacrylates and the like having volatile compounds such as water or the like adsorbed therein; cellulose esters such as ethyl and cellulose the like having volatile compounds such as water or the like adsorbed therein, natural polymeric compounds such as gelatin and the like having volatile compounds such as water or the like adsorbed therein. Examples of low-molecular compounds which are decomposed or modified by heating to generate a gas include compounds such as diazo compounds and azide compounds which are exothermally decomposed to generate a gas.

The thermal decomposition or modification of the heat-sensitive materials as described above occurs preferably at 280° C. or less, more preferably at 230° C. or less.

If a low-molecular compound is used as the heat-sensitive material in the heat-sensitive release layer, it is desirably combined with a binder. For the binder, it is possible to use the above-described polymer which is thermally decomposed or modified in itself to generate a gas, but it is also possible to use a normal polymer binder not having such properties. If the heat-sensitive low-molecular compound is used in combination with the binder, the ratio of the former to the latter is preferably from 0.02:1 to 3:1, and more preferably from 0.05:1 to 2:1. Preferably, almost the whole surface of the light-heat exchange layer is covered with the heat-sensitive release layer, and the thickness of the heat-sensitive release layer is generally in a range of 0.03 to 1 μm, preferably 0.05 to 0.5 μm.

In a case where the transfer material is formed by laminating the light-heat exchange layer, the heat-sensitive release layer and the coloring material layer on the support in that order, the heat-sensitive release layer is decomposed and modified by heat transmitted from the light-heat exchange layer, thus generating a gas. By this decomposition or gas generation, a portion of the heat-sensitive release layer is partially eliminated, or aggregative destruction occurs in the heat-sensitive release layer, lowering the binding force between the light-heat exchange layer and the coloring material layer. Accordingly, depending on the behavior of the heat-sensitive release layer, a portion of the heat-sensitive release layer may adhere to the coloring material layer and appear on the surface of the finally formed image, which will cause a color mixture in the image. Accordingly, it is desired that, even if transfer of the heat-sensitive release layer occurs, the heat-sensitive release layer is hardly colored (that is, it shows high transmissivity of visible rays), so as to prevent the occurrence of color mixture in the formed image. Specifically, the light absorptivity of visible rays of the heat-sensitive release layer is 50% or less, and preferably 10% or less.

Further, the transfer material can also be structured such that, rather than providing an independent heat-sensitive release layer, the heat-sensitive material is added to a coating solution for the light-heat exchange layer, to form a light-heat exchange layer that serves not only as the light-heat exchange layer but also as the heat-sensitive release layer.

In the image-forming method in the first aspect of the invention, it is preferable that the other side of the support than the side on which the coloring material layer has been provided is provided with a light reflection-preventing layer. By providing the light reflection-preventing layer, disturbance of the image or a reduction in resolving power due to irregular reflection of light during a laser-irradiation operation, for imagewise irradiation of the surface of the transfer material with laser light, can be prevented.

The light reflection-preventing layer is generally formed by laminating materials different in refractive index so as to endow the layer with the effect of preventing light reflection. By this method, an effective light reflection-preventing layer can be prepared. Materials having such effects include sulfides such as SnS, InS, GeS and the like, oxides of In, Sn, Te, Ga and Si, and the like.

To prevent flawing, a protective cover film (e.g., a polyethylene terephthalate sheet, polyethylene sheet or the like) can be laminated or the image-receiving material (particularly the image-receiving material described below) can be formed in advance on the surface of the coloring material layer of the transfer material of the present invention.

Image-Receiving Material

The coloring material layer in the transfer material is subjected to imagewise transfer by irradiation with a laser light to form an image on the image-receiving material in the present invention. If the image-receiving material is to be used as a final transfer medium, any medium, such as general paper, a plastic sheet or the like, on which an image can be obtained can be used as the image-receiving material. To obtain a more highly accurate and highly colored image, it is preferable to use a material whose surface has been treated as appropriate for an image-receiving material, to attain suitable conditions for receiving an image (hereinafter, such an image-receiving material is referred to as "image-receiving sheet").

The image-receiving sheet is usually provided with a support and one or more image-receiving layers on the support and, as necessary, with one or more of a cushion layer, a release layer and an intermediate layer between the support and the image-receiving layer. The presence of a back layer at the opposite side of the support to the side of the image-receiving layer is preferable in view of transportability.

(Support)

The support includes a conventional sheet material such as a plastic sheet, metal sheet, glass sheet, paper or the like. Examples of plastic sheets include a polyethylene terephthalate sheet, polycarbonate sheet, polyethylene sheet, polyvinyl chloride sheet, polyvinylidene chloride sheet, polystyrene sheet, styrene-acrylonitrile sheet, polyester sheet and the like. As paper, printing paper, coated paper and the like can be used.

The support preferably has fine voids to prevent curling and to improve image quality. Such a support can be prepared, by for example, mixing a thermoplastic resin with a filler composed of an inorganic pigment or a polymer or the like that is immiscible with the thermoplastic resin, and then forming a resulting mixed melt into a single-layer or multi-layer film with a melt extruder, and further orienting the film monoaxially or biaxially. In this case, a degree of voids is determined by selection of the resin and filler, the mixing ratio thereof, orienting conditions, and the like.

As the thermoplastic resin, polyolefin resins such as polypropylene and the like, and polyethylene terephthalate resin are preferable because of good crystallinity, good orientability, and easy formation of voids. It is preferable that the polyolefin resin or polyethylene terephthalate resin is used as a major component with which a suitably small amount of an other thermoplastic resin is used in combination. The inorganic pigment to be used as the filler preferably has an average particle diameter of 1 to 20° C. Calcium carbonate, clay, diatomaceous earth, titanium oxide, aluminum hydroxide, silica and the like can be used. As the immiscible resin to be used as the filler, polyethylene terephthalate is preferably used in a combination where polypropylene is to be used as the thermoplastic resin.

The content of the filler in the support, the inorganic pigment or the like, is generally of the order of 2 to 30% by volume.

The thickness of the support of the image-receiving sheet is usually 10 to 400° C., and preferably 25 to 200° C. The surface of the support may have been subjected to surface treatments such as corona discharge treatment, glow discharge treatment and the like in order to improve the adhesion to the image-receiving layer (or electroconductive layer, or cushion layer) of the image-receiving sheet or to the coloring material layer of the transfer material.

(Image-receiving layer)

The surface of the image-receiving sheet is preferably provided with one or more image-receiving layers on the support in order to transfer and fix the coloring material layer. The image-receiving layer is preferably a layer formed from an organic polymeric binder as the major component. The binder is preferably a thermoplastic resin, and examples thereof include homopolymers and copolymers of acrylic monomers such as acrylic acid, methacrylic acid, acrylates, methacrylates and the like; cellulose polymers such as methyl cellulose, ethyl cellulose and cellulose acetate; homopolymers and copolymers of vinyl monomers such as polystyrene, polyvinyl pyrrolidone, polyvinyl butyral, polyvinyl alcohol, polyvinyl chloride, and the like; condensed polymers such as polyester and polyamide; and rubber polymers such as butadiene-styrene copolymers. The binder in the image-receiving layer is preferably a polymer having a glass transition temperature (Tg) of 90° C. or less, in order to achieve suitable adhesion to the coloring material layer. For this purpose, a plasticizer can also be added to the image-receiving layer. Further, the binder polymer preferably has a Tg of 30° C. or more, in order to prevent blocking among sheets. As the binder polymer in the image-receiving layer, a polymer identical with or similar to the binder polymer in the coloring material layer is particularly preferable, in view of improvement of the adhesion to the coloring material layer during laser recording and improvement of sensitivity and image strength.

If an image is formed on the image-receiving layer and then re-transferred to regular printing paper or the like, at least one of the image-receiving layers is preferably formed from a photosetting material. Example compositions of such a photosetting material include combinations of a) photopolymerizable monomers that are composed of at least one kind of multifunctional vinyl or vinylidene compound capable of forming a photo-polymerized product by addition polymerization, b) an organic polymer, and c) a photopolymerization initiator, and, as necessary, additives such as a thermal-polymerization inhibitor. As the multifunctional vinyl polymer, unsaturated esters of polyol, particularly acrylates or methacrylates (e.g., ethylene glycol diacrylate or pentaerythritol tetraacrylate) can be used.

As the organic polymer, the above polymer for forming the image-receiving layer can be mentioned. As the photo-polymerization initiator, usual radical photo-polymerization initiators such as benzophenone, Michler's ketone and the like can be used in a proportion of 0.1 to 20% by weight of the layer.

The thickness of the image-receiving layer is 0.3 to 7 μm, and preferably 0.7 to 4 μm. If the thickness is less than 0.3 μm, the layer will be easily broken during re-transfer to regular printing paper due to deficient film strength. If the layer is too thick, glossiness of the image after re-transfer to regular printing paper will increase, and similarity of the resulting image to printed matter will be lowered.

(Other layers)

Further, in the image-forming method of the first aspect of the present invention, the image-receiving material is preferably provided with an electroconductive layer to improve adhesion between the transfer material and the image-receiving material.

Like the electroconductive layer in the transfer material, the electroconductive layer in the image-receiving material may be a layer containing an electroconductive material and a binder. As the binder and the electroconductive material, those used in the electroconductive layer in the transfer material can be used. Further, the surface resistivity of the electroconductive layer in the image-receiving material is preferably $10^{11}$ Ω/□ or less. If the surface resistivity is more than $10^{11}$ Ω/□, charge that is charged by corona discharge on the transfer material will hardly induce a counter-charge on the electroconductive layer in the image-receiving material, which is likely to result in a weakening of adhesion by coulomb force between the transfer material and the image-receiving material. The surface resistivity is preferably not more than $10^9$ Ω/□. The thickness of the electroconductive layer is preferably 0.01 to 2.0 μm, and more preferably 0.05 to 0.5 μm. If this thickness is less than 0.01 μm, the electrical conductance is likely to be insufficient, while if this thickness is more than 2.0 μm, the image-receiving layer is likely to be colored by an electroconductive agent, thus reducing commodity value. Thus, the above range is suitable.

The electroconductive layer is preferably earthed when forming an image. If the electroconductive layer is not earthed, charge on the transfer material will be unlikely to induce counter-charge on the image-receiving material, thus reducing the effect of the electroconductive layer.

A cushion layer may be provided between the support and the image-receiving layer. If the cushion layer is provided, adhesion between the coloring material layer and the image-receiving layer can be improved during laser heat transfer, and quality of the image can be improved. Further, even if foreign matter is mixed in between the transfer material and the image-receiving sheet during recording, gaps between the image-receiving layer and the coloring material layer become small due to deformation action of the cushion layer. As a result, the size of image defects such as missing parts can also be reduced. Further, if the image formed by transfer is transferred to separately prepared regular printing paper or the like, the image-receiving surface is deformed, depending on the unevenness of the paper, and thus transferability of the image-receiving layer can be improved and glossiness of the transferred material can be lowered, thereby improving the similarity to printed matter.

The cushion layer is structured so as to be easily deformed by application of stress to the image-receiving layer. To achieve this effect, the cushion layer is preferably made of a material with low elasticity, a material having rubber elasticity or a thermoplastic resin that is easily softened by heating. The elasticity of the cushion layer is preferably $9.8 \times 10^5$ to $4.9 \times 10^7$ Pa at room temperature, and particularly preferably $2.9 \times 10^6$ to $1.5 \times 10^7$ Pa. For foreign matter such as rubber to penetrate into the cushion layer, a degree of penetration as stipulated under JIS K2530 (25° C., 100 g, 5 seconds) is preferably 10 or more. The glass transition temperature (Tg) of the cushion layer is 80° C. or less, and preferably 25° C. or less. A plasticizer can be suitably added to the polymer binder to regulate these physical properties, such as Tg.

Specific materials that can be used as the binder in the cushion layer include, in addition to rubbers such as urethane rubber, butadiene rubber, nitrile rubber, acrylic rubber, natural rubber and the like, polyethylene, polypropylene, polyester, a styrene-butadiene copolymer, an ethylene-vinyl acetate copolymer, an ethylene-acryl copolymer, a vinyl chloride-vinyl acetate copolymer, vinylidene chloride resin, plasticizer-containing vinyl chloride resin, polyamide resin, phenol resin and the like.

The thickness of the cushion layer depends on the resin used and on other conditions, but is usually 3 to 100 μm, preferably 10 to 52 μm.

The image-receiving layer and the cushion layer should be adhesive-bonded until the laser recording stage, but for transfer of the image onto regular printing paper, these layers are preferably arranged in a releasable manner. To facilitate release, a release layer of 0.1 to 2 μm in thickness is preferably provided between the cushion layer and the image-receiving layer. This release layer preferably functions as a barrier against a coating solvent used for coating of the image-receiving layer.

The image-receiving sheet combined with said transfer M material maybe constituted such that the image-receiving layer also serves as a cushion layer. In this case, the image-receiving sheet may be composed of a support and a cushioning image-receiving layer or of a support, an undercoat and a cushioning image-receiving layer. In this case too, the cushioning image-receiving layer is provided so as to be releasable, to enable re-transfer to regular printing paper. In this case, the image after re-transfer to the regular printing paper is an image excellent in glossiness.

The thickness of the cushioning image-receiving layer is 5 to 100 μm, and preferably 10 to 40 μm.

Further, for improvement of transferability of the image-receiving sheet, it is preferable that the image-receiving sheet is provided with a back layer at the opposite side of the support to the side that is provided with the image-receiving layer. To improve transportability in a recording device, it is preferable to add to the back layer an antistatic agent (e.g. a surfactant or fine particles of tin oxide) and a matting agent (e.g. silicon oxide or PMMA particles).

The above additives can be added not only to the back layer but also to the image-receiving layer and the other layers as necessary. The types of the additives vary depending on intended objectives and cannot be determined unconditionally. However, in the case of, for example, the matting agent, particles of 0.5 to 10 μm average particle diameter can be added in an amount of 0.5 to 80% to the layer. The antistatic agent can be suitably selected from various surfactants and electroconductive agents and used such that the surface resistivity of the layer is $10^{12}$ Ω/□ or less, more preferably 109 Ω/□ or less, under conditions of 23° C. and 50% RH.

Method of Forming an Image

Charging by corona discharge in the first aspect of the present invention can be carried out using, for example, a corotron charger using a wire, but is not particularly limited. Among corona chargers, the corotron charger can charge the face of the coloring material layer uniformly. Charging may be either positive or negative, but positive charging can be used for more uniform charging. A voltage of charging is suitably 5 to 6 kV, depending on properties of the corotron wire.

The transfer material and the image-receiving material can be utilized for forming an image as a laminate in which the coloring material layer of the transfer material is laid on the image-receiving layer of the image-receiving material.

The laminate consisting of the transfer material and the image-receiving material can be formed by various methods. For example, the laminate can be easily obtained by laying the coloring material layer of the transfer material on the image receiving layer of the image-receiving material and passing the resulting laminate through pressing and heating rollers. A heating temperature in this case is preferably 130° C. or less, more preferably 100° C. or less, in the first aspect, and preferably 160° C. or less, more preferably 130° C., in the second aspect.

As another method of obtaining the laminate, vacuum adherence can also be preferably used. Vacuum adherence is a method in which the image-receiving material is wound by suction at vacuum pressure on a rotating drum having a vacuum forming mechanism inside and provided thereon with a large number of fine gaps (i.e. suction holes) for vacuum drawing, and then the transfer material, which is slightly larger than the image-receiving material, is vacuum-bonded to the image-receiving material under uniform extrusion of air by squeeze rollers. As another method, there is also a method in which the image-receiving material is stretched and mechanically stuck to a metal drum, and then the transfer material is mechanically stretched and stuck to the image-receiving material. Among these methods, vacuum adherence is particularly preferable in view of rapid and easy uniform lamination and improvement of an effect for preventing missing portions, without requiring regulation of the temperature of heat rollers or the like.

Attachment of the transfer material to the image-receiving material may be conducted just before the laser irradiation operation.

In the image-forming method in the first aspect of the invention, the transfer material 10 is charged. Thus, upon lamination of the image-receiving material 20 and the transfer material 10, wrinkles may occur. Accordingly, it is preferable that the charged transfer material 10 is laid on the image-receiving material 20 under strong tension.

In the laser light irradiation operation, the laser light is scanned on the transfer material 10 side of the image-forming laminate, usually reciprocating in the width direction of the recording drum 40. During the laser light irradiation operation, the recording drum 40 is rotated at a predetermined angular velocity. Alternatively, recording may be conducted by scanning the laser light over a plane from a laser light output head, without using the recording drum 40 described above.

As the laser light, a direct laser light such as a gas laser light (e.g. an argon ion laser light, helium-neon laser light, helium-cadmium laser light or the like), a solid laser light (e.g. a YAG laser light or the like,) or a semiconductor laser light, colorant laser light, excimer laser light and the like can be utilized. Further, such a laser light maybe passed through a secondary harmonic element, and the light converted to half the original wavelength can be used. In the image-forming method in the present invention, the semi-conductor laser is preferably used in consideration of output power and easy modulation. Further, in the image-forming method of the present invention, irradiation of the laser light is conducted preferably under conditions where the beam diameter at the light-heat exchange layer is in the range of 5 to 50 $\mu$m (particularly 6 to 30 $\mu$m), and the rate of scanning is preferably not less than 1 m/sec. (particularly not less than 3 m/sec.).

In the multi-color image-forming method in the second aspect of the invention, the laser light used in irradiation is characterized by having the form of a multi-beam two-dimensional array. The multi-beam two-dimensional array means that in recording with laser irradiation, a plurality of laser beams is used. A spot arrangement of these laser beams is a two-dimensional plane arrangement consisting of a plurality of lines along a main scanning direction and a plurality of lines along a subsidiary scanning direction.

By use of laser light in a multi-beam two-dimensional array, the time required for laser recording can be reduced.

The image-forming method in the first aspect of the invention can be utilized in production of a black mask or in formation of a monochromic image, and the method can also be utilized advantageously in formation of a multi-color image.

In a method for forming a multi-color image, a large number of image layers (coloring material layers having an image formed thereon) on a plurality of transfer materials may be successively overlaid on the same image-receiving material to form a multi-color image, or images may be formed on image-receiving layers in a plurality of image-receiving materials and then re-transferred to regular printing paper or the like to form a multi-color image.

In the latter case, transfer materials having coloring material layers containing coloring agents having mutually different hues are prepared, and three or more independent image-forming laminates (e.g., the four colors, cyan, magenta, yellow and black) having a transfer material combined with an image-receiving material are produced. Each of these laminates is irradiated with laser light via, for example, a color separation filter in accordance with digital signals based on an image. Next, the transfer material is separated from the image-receiving material to form an image of the respective color on each image-receiving material. Then, the respective color images thus formed are successively superposed on an actual support, such as separately prepared regular printing paper or the like or on a support similar thereto, whereby a multi-color image can be formed.

EXAMPLES

Hereinafter, the present invention is described in more detail by reference to Examples, which however are not intended to limit the present invention. Unless otherwise specified, "parts" means "parts by weight".

Example 1

<Preparation of transfer material>

1) Formation of an electroconductive layer on a support

The respective components shown in the composition of a coating solution described below were mixed during stirring by a stirrer and then dispersed for 1 hour in a paint shaker (Toyo Seiki Co., Ltd.) to prepare the coating solution for the electroconductive layer.

Composition of the coating solution for the electroconductive layer

| | |
|---|---|
| Binder (RIKACOAT SN-20, produced by New Japan Chemical Co., Ltd.) | 200 parts |
| N-Methyl-2-pyrrolidone | 2000 parts |
| Surfactant (Megafac F-177, produced by Dainippon Ink and Chemicals, Inc) | 0.5 parts |
| Fine tin oxide particles 1 | 100 parts |

The tin oxide 1 in the composition was prepared by the following method.

80 parts of fine particles of a tin oxide-antimony oxide complex described in the Examples in JP-A No. 61-20033, 160 parts of N-methyl-2-pyrrolidone and 80 parts of zirconia beads of 1 mm in diameter were introduced into a vessel of stainless steel and dispersed for 6 hours in a paint shaker.

One side of the support (polyethylene terephthalate film of A4 size with a thickness of 75 μm) was coated with the above coating solution for the electroconductive layer by a rotating coater (Whirler), and this coated material was dried for 2 minutes in an oven at 100° C. to form an electroconductive layer with a dry film thickness of 0.16 μm.

The surface resistivity thereof, as determined at 25° C. in a 60% RH atmosphere, was $2\times10^7$ $\Omega/\square$.

2) Formation of a light-heat exchange layer

The respective components shown in the composition of a coating solution described below were mixed during stirring by a stirrer and then dispersed for 1 hour in a paint shaker (Toyo Seiki Co., Ltd.) to prepare the coating solution for the light-heat exchange layer.

Composition of the coating solution for the light-heat exchange layer

| | |
|---|---|
| Light-heat exchange material (NK-2014, an infrared absorbing colorant, produced by Nippon Hasshoku Shikiso Co., Ltd.) | 10 parts |
| Binder (RIKACOAT SN-20, produced by New Japan Chemical Co., Ltd.) | 200 parts |
| N-Methyl-2-pyrrolidone | 2000 parts |
| Surfactant (Megafac F-177, Dainippon Ink and Chemicals, Inc) | 1 part |

The support on which the electroconductive layer was formed in item 1) above was coated, at a side not provided with the electroconductive layer, with the above coating solution for the light-heat exchange layer by a rotating coater (Whirler), and this coated material was dried for 2 minutes in an oven at 100° C. to form an intermediate layer having light-heat exchange ability on the support.

The resulting light-heat exchange layer had an absorption maximum in the wavelength range of 700 to 1000 nm in the vicinity of 830 nm. Absorbance (optical density (OD)) was measured with a Macbeth densitometer, which indicated an OD of 1.08.

3) Formation of a yellow ink layer (coloring material layer)

The respective components in the following composition of a mother liquor having a pigment dispersed therein were dispersed for 2 hours in a paint shaker (Toyo Seiki Co., Ltd.), the glass beads were removed, and the mother liquid having the yellow pigment dispersed therein was thus prepared.

Composition of another liquid having a yellow pigment dispersed therein

| | |
|---|---|
| 20 wt-% polyvinyl butyral solution (DENKA BUTYRAL #2000-L with a Vicat softening point of 57° C., produced by Denki Kagaku Kogyo K.K.) | 12 parts |
| Coloring material (yellow pigment (C.I. Pigment Yellow 14)) | 24 parts |
| Dispersant assistant (SOLSPERSE S-20000, produced by ICI) | 0.8 parts |
| n-Propyl alcohol | 110 parts |
| Glass beads | 100 parts |

The respective components shown in the composition of a coating solution described below were mixed during stirring by a stirrer to prepare a coating solution for a yellow ink layer.

Composition of the coating solution

| | |
|---|---|
| The mother liquor having the yellow pigment dispersed therein | 20 parts |
| n-Propyl alcohol | 60 parts |
| Surfactant | 0.05 parts |

(Megafac F-176PF, Dainippon Ink and Chemicals, Inc.)

The light-heat exchange layer formed in item 2) above was coated for 1 minute with the above coating solution for the yellow ink layer by a Whirler, and the coated material was dried for 2 minutes in an oven at 100° C. to form the yellow ink layer (64.2% by weight of the pigment, 33.7% by weight of polyvinyl butyral) on the intermediate layer. This resulting ink layer was measured for absorbance (optical density (OD)) with a Macbeth densitometer, which indicated an OD of 0.7. The thickness of the ink layer was measured in the same manner as for the intermediate layer above, indicating a thickness of 0.4 μm on average.

Thereafter, measurement of surface resistivity at ordinary temperature and ordinary humidity indicated $1.2\times10^{12}$ $\Omega/\square$.

By the process described above, a transfer material having an electroconductive layer on one side of a support and a light-heat exchange layer and coloring material layer provided on another side of the support was prepared.

<Preparation of an image-receiving material>

1) Formation of an electroconductive layer

A coating solution used for the electroconductive layer was the same as the coating solution used for formation of the electroconductive layer in the transfer material, except that the binder in the coating solution used for formation of the electroconductive layer in the transfer material was replaced by a vinyl chloride/vinyl acetate copolymer. One side of a support (a polyethylene terephthalate sheet of A4 size with a thickness of 100 μm) was coated with the coating solution in the same manner as for formation of the electroconductive layer in the transfer material, to form an electroconductive layer (film thickness, 0.15 μm) of the image-receiving material. The surface resistivity of the resulting electroconductive layer was $7.2\times10^7$ $\Omega/\square$.

2) Formation of an image-receiving layer

① Formation of a first image-receiving layer

The respective components shown in the composition of a coating solution described below were mixed during stirring by the stirrer to prepare the coating solution for the first image-receiving layer.

Composition of the coating solution for the first image-receiving layer

| | |
|---|---|
| Vinyl chloride/vinyl acetate copolymer (MPR-TSL, Nissin Chemical Industry Co., Ltd.) | 25 parts |
| Dibutyloctyl phthalate (DOP, Daiachi Kagaku Co., Ltd.) | 12 parts |
| Surfactant (Megafac F-177, Dainippon Ink and Chemicals, Inc) | 4 parts |
| Solvent (methyl ethyl ketone) | 75 parts |

The surface of the electroconductive layer formed in item 1) above was coated with the coating solution for the first image-receiving layer by a Whirler, and the coated material was dried for 2 minutes in an oven at 100° C. to form the first image-receiving layer (thickness, 20 μm).
② Formation of a second image-receiving layer
The respective components shown in the composition of a coating solution described below were mixed during stirring by a stirrer to prepare the coating solution for the second image-receiving layer.
Composition of the coating solution for the second image-receiving layer

| | |
|---|---|
| Polyvinyl butyral (DENKA BUTYRAL #2000-L, Denki Kagaku Kogyo K.K.) | 16 parts |
| N,N-dimethylacrylamide/butyl acrylate copolymer | 4 parts |
| Surfactant (Megafac F-177, Dainippon Ink and Chemicals, Inc) | 0.5 parts |
| Solvent (n-propyl alcohol) | 200 parts |

The surface of the first image-receiving layer formed in item ① above was coated with the coating solution for the second image-receiving layer by a Whirler, and the coated material was dried for 2 minutes in an oven at 100° C. to form the second image-receiving layer (thickness, 2 μm)
By the process described above, an image-receiving material having an electroconductive layer and two image-receiving layers laminated on a support was prepared.
<Formation of an image>
Formation of an image was conducted using the image-forming device shown in FIG. 1. Specifically, the image-receiving material was fed to the surface of a recording drum provided with suction holes (not shown) for vacuum adsorption, such that the image-receiving layer was facing outward, and the image-receiving material was joined to the surface of the drum by vacuum pressure. The transfer material was fed to the image-receiving material such that the coloring material layer was facing the image-receiving layer of the image-receiving material. The face of the coloring material layer in the transfer material was charged by corona discharge with a corotron charger placed before the position where the image-receiving material was brought into contact with the transfer material. Charging voltage was 0.7 kV. The electroconductive layer in the image-receiving material and the recording drum were earthed. The transfer material thus charged was transferred to the recording drum and laid over the image-receiving material. These laminated materials were irradiated with laser light from a laser irradiation unit, not shown, to transfer the coloring material layer to the image-receiving layer.
As the laser light, a semiconductor laser light with a wavelength of 830 nm was condensed to form a spot with a diameter of 7 μm on the surface of the light-heat exchange layer and moved (subsidiary scanning) in a direction perpendicular to a rotating direction of the recording drum 14 (main scanning direction), to conduct laser image recording on the laminate for image formation. The laser irradiation conditions were as follows:

Laser power: 110 mW
Main scanning rate: 4 m/sec.
Subsidiary scanning pitch (amount of subsidiary scanning/rotation): 20 μm After the laser image recording described above had been conducted, the laminate for image formation was removed from the recording drum 14, and the image-receiving material 12 was peeled from the transfer material 10 by hand, to form an image on the image-receiving material 12.
The resulting image was of very good quality.

Example 2

Preparation of transfer material K (black)
1) Preparation of a coating solution for a light-heat exchange layer
The following respective components were mixed during stirring in a stirrer to prepare a coating solution for a light-heat exchange layer.
Composition of the coating solution of the light-heat exchange layer

| | |
|---|---|
| Infrared absorbing pigment ("NK-2014", produced by Nippon Kanko Shikiso Co., Ltd.) | 7.6 parts |
| Polyimide resin ("RIKACOAT SN-20" having a thermal decomposition temperature of 510° C., produced by New Japan Chemical Co., Ltd.) | 29.3 parts |
| N,N-dimethylformamide | 1500 parts |
| Methyl ethyl ketone | 360 parts |
| Surfactant ("Megafac F-177", produced by Dainippon Ink and Chemicals, Inc.) | 0.5 part |
| Matting agent | 1.7 parts |

("SEAHOSTAR KEP150": silica gel particles, produced by Nippon Shokubai Co., Ltd.)
2) Formation of the light-heat exchange layer on the surface of a support
One surface (central line average roughness, 0.04 μm) of a polyethylene terephthalate film (support) of 75 μm thickness was coated with the above coating solution for the light-heat exchange layer by a rotating applicator (Whirler), and the coated material was dried for 2 minutes in an oven at 120° C. to form the light-heat exchange layer on the support. The resulting light-heat exchange layer showed absorption at a wavelength in the vicinity of 830 nm, and absorbance (optical density (OD)) was measured by a UV-visible spectrophotometer UV-2400 (Shimadzu Corporation), which indicated an OD of 0.9. The thickness of the light-heat exchange layer was 0.3 μm on average, as determined by observation of a section thereof under a scanning electron microscope.
3) Preparation of a coating solution for a black coloring material layer
The following respective components were introduced into a kneader mill and preliminary dispersed by application of shearing force while a small amount of solvent was added thereto. A solvent was added to the resulting dispersion to finally prepare the following composition, which was then dispersed for 2 hours in a sand mill to provide a mother liquor having a pigment dispersed therein.

Composition of the mother liquor having a black pigment dispersed therein

| | |
|---|---|
| Polyvinyl butyral | 12.6 parts |
| ("ESRECK B BL-SH", produced bu Sekisui Chemical Co., Ltd.) | |
| Pigment | 10.5 parts |
| (Carbon black "MA-100" with a PVC blackness of 10, produced by Mitsubishi Chemical Industries Ltd.) | |
| Pigment | 4.5 parts |
| (Carbon black "#5" with a PVC blackness of 1, produced by Mitsubishi Chemical Industries Ltd.) | |
| Dispersant assistant | 0.8 parts |
| ("SOLSPERSE S-20000", produced by ICI) | |
| n-Propyl alcohol | 79.4 parts |

Then, the following respective components were mixed in a stirrer to prepare a coating solution for the black coloring material layer.

Composition of a coating solution for the black coloring material layer

| | |
|---|---|
| The mother liquor having the black pigment dispersed therein | 185.7 parts |
| Polyvinyl butyral | 11.9 parts |
| ("ESRECK B BL-SH", produced by Sekisui Chemical Co., Ltd.) | |
| Wax compounds | |
| (Stearic amide "NEWTRON 2", produced by Nippon Fine Chemical Co., Ltd.) | 1.7 parts |
| (Behenic amide "DIAMID BM", produced by Nippon Kasei Chemical Co., Ltd.) | 1.7 parts |
| (Lauric amide "DIAMID Y", produced by Nippon Kasei Chemical Co., Ltd.) | 1.7 parts |
| (Palmitic amide "DIAMID KP", produced by Nippon Kasei Chemical Co., Ltd.) | 1.7 parts |
| (Erucic amide "DIAMID L-200", produced by Nippon Kasei Chemical Co., Ltd.) | 1.7 parts |
| (Oleic amide "DIAMID O-200", produced by Nippon Kasei Chemical Co., Ltd.) | 1.7 parts |
| Rosin | 11.4 parts |
| ("KE-311", produced by Arakawa Kagaku Co., Ltd.) | |
| Surfactant | 2.1 parts |
| ("Megafac F-176P" with a solid content of 20%, produced by Dainippon Ink and Chemicals, Inc.) | |
| Inorganic pigment | 7.1 parts |
| ("MEK-ST", 30% methyl ethyl ketone solution, produced by Nissan Kagaku Co., Ltd.) | |
| n-Propyl alcohol | 1050 parts |
| Methyl ethyl ketone | 295 parts |

Particles in the resulting coating solution for the black coloring material layer were measured by a particle distribution-measuring device with a laser scattering system, which indicated that the average particle diameter was 0.25 $\mu$m and a proportion of particles of 1 $\mu$m or more was 0.5%.

4) Formation of the black coloring material layer on the surface of the light-heat exchange layer.

The surface of the light-heat exchange layer was coated for 1 minute with the above coating solution for the black coloring material layer, and the coated material was dried for 2 minutes in an oven at 100° C., to form the black coloring material layer on the light-heat exchange layer. A transfer material K having the light-heat exchange layer and the black coloring material layer provided in that order on the support was prepared by the process described above.

The optical density (OD) of the black coloring material layer in the transfer material K was measured by a Macbeth densitometer "TD-904" (W filter), which indicated an OD of 0.91. The thickness of the black coloring material layer was determined to be 0.60 $\mu$m on average.

Preparation of transfer material Y (yellow)

A transfer material Y was prepared in the same manner as for preparation of the above transfer material K except that a coating solution for a yellow coloring material layer with the following composition was used in place of the coating solution for the black coloring material layer. The thickness of the coloring material layer in the resulting transfer material Y was 0.42 $\mu$m.

Composition of a mother liquor having a yellow pigment dispersed therein

| | |
|---|---|
| Polyvinyl butyral | 7.1 parts |
| ("ESRECK B BL-SH", produced by Sekisui Chemical Co., Ltd.) | |
| Pigment | 12.9 parts |
| (Yellow pigment (P. Y. 139)) | |
| Dispersant assistant | 0.6 parts |
| ("SOLPERSE S-20000", produced by ICI) | |
| n-Propyl alcohol | 79.4 parts |

Composition of a coating solution for a yellow coloring material layer

| | |
|---|---|
| The mother liquor having the yellow pigment dispersed therein | 126 parts |
| Polyvinyl butyral ("ESRECK B BL-SH", produced by Sekisui Chemical Co., Ltd.) | 4.6 parts |
| Wax compounds | |
| (Stearic amide "NEWTRON 2", produced by Nippon Fine Chemical Co., Ltd.) | 0.7 parts |
| (Behenic amide "DIAMID BM", produced by Nippon Kasei Chemical Co., Ltd.) | 0.7 parts |
| (Lauric amide "DIAMID Y", produced by Nippon Kasei Chemical Co., Ltd.) | 0.7 parts |
| (Palmitic amide "DIAMID KP", produced by Nippon Kasei Chemical Co., Ltd.) | 0.7 parts |
| (Erucic amide "DIAMID L-200", produced by Nippon Kasei Chemical Co., Ltd.) | 0.7 parts |
| (Oleic amide "DIAMID O-200", produced by Nippon Kasei Chemical Co., Ltd.) | 0.7 parts |
| Nonionic surfactant ("CHEMISTAT 1100", produced by Sanyo Chemical Industries, Ltd.) | 0.4 parts |
| Rosin ("KE-311", produced by Arakawa Kagaku Co., Ltd.) | 2.4 parts |
| Surfactant ("Megafac F-176P" with a solid content of 20%, produced by Dainippon Ink and Chemicals, Inc.) | 0.8 parts |
| n-Propyl alcohol | 793 parts |
| Methyl ethyl ketone | 198 parts |

Preparation of transfer material M (magenta)

A transfer material M was prepared in the same manner as for preparation of the above transfer material K except that a coating solution for a magenta coloring material layer with the following composition was used in place of the coating solution for the black coloring material layer. The thickness of the coloring material layer in the resulting transfer material M was 0.38 μm.

Composition of a mother liquor having a magenta pigment dispersed therein

| | |
|---|---|
| Polyvinyl butyral ("DENKA BUTYRAL #2000-L" with a Vicat softening point of 57° C., produced by Denki Kagaku Kogyo K.K.) | 12.6 parts |
| Pigment (Magenta pigment "Shimura Brilliant Carmine 6B-229", produced by Dainippon Ink and Chemicals, Inc.) | 15.0 parts |
| Dispersion assistant ("SOLSPERSE S-20000", produced by ICI) | 0.6 parts |
| n-Propyl alcohol | 79.4 parts |

Composition of a coating solution for the magenta coloring material layer

| | |
|---|---|
| The mother liquor having the magenta pigment dispersed therein | 163 parts |
| Polyvinyl butyral ("DENKA BUTYRAL #2000-L" with a Vicat softening point of 57° C., produced by Denki Kagaku Kogyo K.K.) | 4.0 parts |
| Wax compounds | |
| (Stearic amide "NEWTRON 2", produced by Nippon Fine Chemical Co., Ltd.) | 1.0 part |
| (Behenic amide "DIAMID BM", produced by Nippon Kasei Chemical Co., Ltd.) | 1.0 part |
| (Lauric amide "DIAMID Y", produced by Nippon Kasei Chemical Co., Ltd.) | 1.0 part |
| (Palmitic amide "DIAMID KP", produced by Nippon Kasei Chemical Co., Ltd.) | 1.0 part |
| (Erucic amide "DIAMID L-200", produced by Nippon Kasei Chemical Co., Ltd.) | 1.0 part |
| (Oleic amide "DIAMID O-200", produced by Nippon Kasei Chemical Co., Ltd.) | 1.0 part |

| | |
|---|---|
| Nonionic surfactant ("CHEMISTAT 1100", produced by Sanyo Chemical Industries, Ltd.) | 0.7 parts |
| Rosin ("KE-311", produced by Arakawa Kagaku Co., Ltd.) | 4.6 parts |
| Monomer ("PET-4A", produced by Shin Nakamura Kagaku Co., Ltd.) | 2.5 parts |
| Surfactant ("Megafac F-176P" with a solid content of 20%, produced by Dainippon Ink and Chemicals, Inc.) | 1.3 parts |
| n-Propyl alcohol | 848 parts |
| Methyl ethyl ketone | 246 parts |

Preparation of transfer material C (cyan)

A transfer material C was prepared in the same manner as for preparation of the above transfer material K except that a coating solution for a cyan coloring material layer with the following composition was used in place of the coating solution for the black coloring material layer. The thickness of the coloring material layer in the resulting transfer material C was 0.45 μm.

Composition of a mother liquor having a cyan pigment dispersed therein

| | |
|---|---|
| Polyvinyl butyral ("ESRECK B BL-SH", produced by Sekisui Chemical Co., Ltd.) | 12.6 parts |
| Pigment (Cyan pigment (Pigment Blue 15, "#700-10 FG CY-Blue")) | 15.0 parts |
| Dispersion assistant ("PW-36", produced by Kusumoto Kasei Co., Ltd.) | 0.8 parts |
| n-Propyl alcohol | 110 parts |

Composition of a coating solution of the cyan coloring material layer

| | |
|---|---|
| The mother liquor having the cyan pigment dispersed therein | 118 parts |
| Polyvinyl butyral ("ESRECK B BL-SH", produced by Sekisui Chemical Co., Ltd.) | 5.2 parts |
| Wax compounds | |
| (Stearic amide "NEWTRON 2", produced by Nippon Seika Co., Ltd.) | 1.0 part |
| (Behenic amide "DIAMID BM", produced by Nippon Kasei Chemical Co., Ltd.) | 1.0 part |
| (Lauric amide "DIAMID Y", produced by Nippon Kasei Chemical Co., Ltd.) | 1.0 part |
| (Palmitic amide "DIAMID KP", produced by Nippon Kasei Chemical Co., Ltd.) | 1.0 part |
| (Erucic amide "DIAMID L-200", produced by Nippon Kasei Chemical Co., Ltd.) | 1.0 part |
| (Oleic amide "DIAMID O-200", produced by Nippon Kasei Chemical Co., Ltd.) | 1.0 part |
| Rosin ("KE-311", produced by Arakawa Kagaku Co., Ltd.) | 2.8 parts |
| Monomer ("PET-4A", produced by Shin Nakamura Kagaku Co., Ltd.) | 1.7 parts |
| Surfactant ("Megafac F-176P" with a solid content of 20%, produced by Dainippon Ink and Chemicals, Inc.) | 1.7 parts |
| n-Propyl alcohol | 890 parts |
| Methyl ethyl ketone | 247 parts |

Preparation of an image-receiving sheet

A coating solution for a cushion immediate layer and a coating solution for an image-receiving layer, having the following compositions, were prepared.

1) Coating solution for the cushion intermediate layer

| | |
|---|---|
| Vinyl chloride/vinyl acetate copolymer (MPR-TSL, produced by Nissin Chemical Industry Co., Ltd.) | 20 parts |
| Plasticizer ("PARAPLEX G-40", produced by CP. HALL. COMPANY) | 10 parts |
| Surfactant (Megafac F-177, produced by Dainippon Ink and Chemicals, Inc.) | 0.5 parts |
| Antistatic agent ("SAT-S Supper (IC)", Nippon Junyaku Co., Ltd.) | 0.3 parts |
| Methyl ethyl ketone | 60 parts |
| Toluene | 10 parts |
| N,N-dimethylformamide | 3 parts |
| 2) Coating solution for the image-receiving layer | |
| Polyvinyl butyral ("ESRECK B BL-SH", produced by Sekisui Chemical Co., Ltd.) | 8 parts |
| Antistatic agent ("SUNSTAT 2012A", produced by Sanyo Chemical Industries, Ltd.) | 0.7 part |
| Surfactant ("Megafac F-177", produced by Dainippon Ink and Chemicals, Inc.) | 0.1 part |
| n-Propyl alcohol | 20 parts |
| Methanol | 20 parts |
| 1-Methoxy-2-propanol | 50 parts |

Using a small-width coating machine, the above coating solution for the cushion intermediate layer was coated onto a white PET support ("LUMILAR E-68L" with a thickness of 135 μm, produced by Toray Co., Ltd.), this coated layer was dried, and the coating solution for the image-receiving layer was coated thereon and dried. The amounts of the coating solutions were regulated such that the thickness of the cushion intermediate layer after drying was about 20 μm, and the thickness of the image-receiving layer was about 2 μm. The prepared material was wound into a roll, stored at room temperature for 1 week and used for image recording with laser light as described below.

Formation of a transferred image

The image-receiving sheet (25 cm×35 cm) prepared above was wound and vacuum-adsorbed onto a rotating drum 25 cm in diameter provided with vacuum section holes 1 mm in diameter (surface density: 1 hole for an area of 3 cm×8 cm). Then, the transfer material K (black), cut to 30 cm×40 cm, and was laid thereover, so as to stick out uniformly from the image-receiving sheet. While being squeezed by squeeze rollers, the transfer material was joined and laminated by air-suction from the section holes. A degree of reduced pressure with the section holes thus covered was −150 mmHg relative to 1 atmosphere. The drum was rotated. A semiconductor laser light with a wavelength of 830 nm was condensed to form a spot with a diameter of 7 μm on the surface of the light-heat exchange layer in the laminate on the drum, and then moved (subsidiary scanning) in a direction perpendicular to the rotation direction (main scanning direction) of the recording drum, thus recording a laser image (image line) on the laminate. The laser irradiation conditions were as follows. The laser beam used in this example made use of a laser beam consisting of a multi-beam two-dimensional array forming a parallelogram of 5 rows of beams in the main scanning direction and 3 rows of beams in the subsidiary scanning direction.

Laser power: 110 mW
Main scanning rate: 6 m/sec.
Subsidiary scanning pitch: 6.35 μm
Environmental temperature and humidity: 3 conditions: 18° C. and 30%, 23° C. and 50%, 26° C. and 65%.

After the laser image recording described above had finished, the laminate was removed from the drum. When the transfer material K was peeled from the image-receiving sheet by hand, it was confirmed that only an irradiated region of the coloring material layer in the transfer material K had transferred from the transfer material K to the image-receiving sheet.

In the same manner as above, an image was transferred from each of the transfer material Y, the transfer material M, and the transfer material C to the image-receiving sheet. When the four transferred color images were further laid over and Stat transferred onto recording paper to form a multi-color image, a high-quality multi-color image with stable transfer density could be formed, even with laser recording with high energy laser light in a multi-beam two-dimensional array under different temperatures and humidities.

<Measurement of reflection density (OD) of a black image portion and calculation of rate of image transfer>

The density of the transferred image obtained using the above transfer material K (black) under the respective temperature and humidity conditions was measured with a reflective Macbeth densitometer "RD-918" (W filter). The reflection density (OD) was obtained as shown in Table 1 below.

The above transfer material K was transferred to a image-receiving sheet using a thermal laminator, without laser recording. Reflection density (OD) of a resulting black image, as determined by the method described above, was 1.88. Rates of transfer of the image by laser recording were 98.4%, 96.8% and 96.3%, respectively.

<Evaluation of quality of the black image>

A solid portion and a line image portion of the transferred images obtained using the above transfer material K (black) under the respective temperature and humidity conditions were observed under an optical microscope. A black transferred image having no gaps in the solid portion and a good resolution of the line image, with little dependence on environmental conditions, had been obtained. Evaluation of image qualities was conducted by visual examination using the following criteria:

Solid portion
○: Recording gaps and transfer defects were not present.
Δ: Recording gaps and transfer defects were partially present.
X: Recording gaps and transfer defects were present over the whole surface.

Line image portion
○: The edge of the line image portion was sharp with good resolving power.
Δ: The edge of the line image portion was not smooth, and bridging occurred in parts.
X: Bridging occurred over the whole surface.

Example 3

A multi-color image was formed in the same manner as in Example 2 except that the following transfer material (K-2) was used in place of the transfer material K, and as a result, a high-quality multi-color image with stable transfer density could be formed, even by laser recording with high energy laser light in a multi-beam two-dimensional array under different temperatures and humidities.

The transfer material (K-2) was prepared in the same manner as in Example 2 except that carbon black "#5" used for preparation of the coating solution for the black coloring material layer in the transfer material K was replaced by carbon black "MA-100". (thickness of the coloring material layer: 0.59 μm).

The resulting transfer material (K-2) was used, reflection density (OD) of a black image portion was measured, the transfer rate of the image was calculated, and the quality of the black image was evaluated (solid density with the thermal laminator: 2.01), in the same manner as in Example 2. The evaluation results are shown in Table 1 below.

Example 4

A multi-color image was formed in the same manner as in Example 2 except that the following transfer material (K-3) was used in place of the transfer material K, and as a result, a high-quality multi-color image with stable transfer density could be formed, even by laser recording with high energy laser light in a multi-beam two-dimensional array under different temperatures and humidities.

The transfer material (K-3) was prepared in the same manner as in Example 2 except that carbon black "MA-100" used for preparation of the coating solution for the black coloring material layer in the transfer material K was replaced by carbon black "#5". (thickness of the coloring material layer: 0.62 μm)

The resulting transfer material (K-3) was used, reflection density (OD) of a black image portion was measured, the transfer rate of the image was calculated, and the quality of the black image was evaluated (solid density with the thermal laminator: 1.79), in the same manner as in Example 2. The evaluation results are shown in Table 1 below.

Example 5

A multi-color image was formed in the same manner as in Example 2 except that the following transfer material (K-4) was used in place of the transfer material K, and as a result, a high-quality multi-color image with stable transfer density could be formed, even by laser recording with high energy laser light in a multi-beam two-dimensional array under different temperatures and humidities.

The transfer material (K-4) was prepared in the same manner as in Example 2 except that carbon black "#5" used for preparation of the coating solution for the black coloring material layer in the transfer material K was replaced by carbon black "#20" (PVC blackness of 4, produced by Mitsubishi Chemical Industries Ltd.). (thickness of the coloring material layer: 0.60 μm)

The resulting transfer material (K-4) was used, reflection density (OD) of a black image portion was measured, the transfer rate of the image was calculated, and the quality of the black image was evaluated (solid density with the thermal laminator: 1.92), in the same manner as in Example 2. The evaluation results are shown in Table 1 below.

Comparative Example 1

A multi-color image was formed in the same manner as in Example 2 except that the following transfer material (K-5) was used in place of the transfer material K, and as a result, solid image density was significantly reduced when laser recording was conducted under higher humidity conditions.

The transfer material (K-5) was prepared in the same manner as in Example 2 except that the thickness of the black coloring material layer in the transfer material K was changed from 0.60 μm to 0.45 μm.

The resulting transfer material (K-5) was used, reflection density (OD) of a black image portion was measured, the transfer rate of the image was calculated, and the quality of the black image was evaluated (solid density with the thermal laminator: 1.41), in the same manner as in Example 2. The evaluation results are shown in Table 1 below.

Comparative Example 2

A multi-color image was formed in the same manner as in Example 2 except that the following transfer material (K-6) was used in place of the transfer material K, and as a result, gaps were observed in a solid portion under conditions of 18° C. and 30% RH. Further, the resolving power of a line image portion was deteriorated.

The transfer material (K-6) was prepared in the same manner as in Example 1 except that the thickness of the black coloring material layer in the transfer material K was changed from 0.60 μm to 0.75 μm.

The resulting transfer material (K-6) was used, reflection density (OD) of a black image portion was measured, the transfer rate of the image was calculated, and the quality of the black image was evaluated (solid density with the thermal laminator: 2.26), in the same manner as in Example 2. The evaluation results are shown in Table 1 below.

Comparative Example 3

A multi-color image was formed in the same manner as in Comparative Example 1 except that a single laser beam was used in place of the multi-beam two-dimensional array. As a result, the reduction of density in a solid portion that occurred in Comparative Example 1 did not occur.

Using the transfer material (K-5) obtained in Comparative Example 1, reflection density (OD) of a black image portion was measured in the same manner as in Comparative Example 1 except that the single laser beam was used in place of the multi-beam two-dimensional array, the transfer rate of the image was calculated, and the quality of the black image was evaluated (solid density with the thermal laminator: 1.41). The evaluation results are shown in Table 1 below.

TABLE 1

| | temperature and humidity | Reflection density (OD) | Transfer Rate (%) | Image quality Solid portion | Line image portion |
|---|---|---|---|---|---|
| Example 2 | 18° C., 30% RH | 1.85 | 98.4 | ○ | ○ |
| | 23° C., 50% RH | 1.82 | 96.8 | ○ | ○ |
| | 26° C., 65% RH | 1.81 | 96.3 | ○ | ○ |
| Example 3 | 18° C., 30% RH | 1.94 | 96.5 | ○ | ○ |
| | 23° C., 50% RH | 1.91 | 95.0 | ○ | ○ |
| | 26° C., 65% RH | 1.89 | 94.0 | ○ | ○ |
| Example 4 | 18° C., 30% RH | 1.75 | 97.8 | ○ | ○ |
| | 23° C., 50% RH | 1.74 | 97.2 | ○ | ○ |
| | 26° C., 65% RH | 1.70 | 95.0 | ○ | ○ |
| Example 5 | 18° C., 30% RH | 1.88 | 97.9 | ○ | ○ |
| | 23° C., 50% RH | 1.86 | 96.9 | ○ | ○ |
| | 26° C., 65% RH | 1.84 | 95.8 | ○ | ○ |
| Comparative Example 1 | 18° C., 30% RH | 1.31 | 92.9 | ○ | ○ |
| | 23° C., 50% RH | 1.24 | 87.9 | Δ | ○ |
| | 26° C., 65% RH | 1.06 | 75.2 | X | ○ |
| Comparative Example 2 | 18° C., 30% RH | 2.10 | 92.9 | X | X |
| | 23° C., 50% RH | 2.25 | 99.6 | ○ | Δ |
| | 26° C., 65% RH | 2.24 | 99.1 | ○ | X |
| Comparative Example 3 | 18° C., 30% RH | 1.38 | 97.9 | ○ | ○ |
| | 23° C., 50% RH | 1.35 | 95.7 | ○ | ○ |
| | 26° C., 65% RH | 1.33 | 94.3 | ○ | ○ |

N.B.: The laser recording in Comparative Example 3 took a long time.

From the results in Table 1, it is understood that the black transfer materials used in the multi-color image-forming method of the present invention in Examples 2 to 5 have excellent image quality even under different temperature and humidity conditions.

In the black transfer material used in the multi-color image-forming method in Comparative Example 1, on the other hand, the transfer rate in the solid portion was significantly reduced under highly humid conditions. Further, in the black transfer material used in the multi-color image-forming method in Comparative Example 2, gaps resulting from insufficient transfer occurred in the solid portion under low humidity conditions, and the resolving power of the line-image portion was significantly worsened. Further, in Comparative Example 3, where a single laser beam was used in place of the multi-beam two-dimensional array, the reduced rate of transfer in the solid portion that occurred in Comparative Example 1 did not occur, but the time required for laser recording was longer.

What is claimed is:

1. A method for forming a multi-color image, the method comprising the steps of:
   providing an image-receiving material, which has an image-receiving layer, and four transfer materials, of yellow, magenta, cyan and black, each of which has, on a support, at least a light-heat conversion layer and a coloring material layer;
   opposing and superposing the coloring material layer of each transfer material with the image-receiving layer of the image-receiving material; and
   irradiating laser light, which is a multi-beam 2-dimensional array of laser beams, from a support side of the each transfer material, thereby transferring a laser-light irradiated region of the coloring material layer of the each transfer material onto the image-receiving layer of the image-receiving material, for recording the image,
   wherein layer thickness of the coloring material layer of the black transfer material is greater than layer thickness of the coloring material layer of each of the yellow, magenta and cyan transfer materials, and the layer thickness of the coloring material layer of the black transfer material is from 0.5 to 0.7 μm.

2. The method for forming a multi-color image according to claim 1, wherein the laser light is semiconductor laser light.

3. The method for forming a multi-color image according to claim 1, wherein optical density at 830 nm of the light-heat exchange layer is 0.7 to 1.1.

4. The method for forming a multi-color image according to claim 1, wherein the coloring material layer of the black transfer material contains carbon black.

5. The method for forming a multi-color image according to claim 4, wherein the carbon black is composed of at least two kinds of carbon black, which are different in tinting strength.

6. The method for forming a multi-color image according to claim 1, wherein the layer thickness of the coloring it material layer of each of the yellow, magenta and cyan transfer materials is from 0.2 to 0.5 μm.

7. The method for forming a multi-color image according to claim 2, wherein optical density at 830 nm of the light-heat exchange layer is 0.7 to 1.1.

8. The method for forming a multi-color image according to claim 2, wherein the coloring material layer of the black transfer material contains carbon black.

9. The method for forming a multi-color image according to claim 8, wherein the carbon black is composed of at least two kinds of carbon black, which are different in tinting strength.

10. The method for forming a multi-color image according to claim 2, wherein the layer thickness of the coloring material layer of each of the yellow, magenta and cyan transfer materials is from 0.2 to 0.5 μm.

* * * * *